(12) United States Patent
Hinode et al.

(10) Patent No.: US 10,784,126 B2
(45) Date of Patent: Sep. 22, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Taiki Hinode, Kyoto (JP); Sadamu Fujii, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/048,437

(22) Filed: Jul. 30, 2018

(65) Prior Publication Data
US 2019/0067046 A1 Feb. 28, 2019

(30) Foreign Application Priority Data

Aug. 31, 2017 (JP) .................................. 2017-166502

(51) Int. Cl.
H01L 21/67 (2006.01)
H01L 21/02 (2006.01)
(52) U.S. Cl.
CPC .. H01L 21/67034 (2013.01); H01L 21/02057 (2013.01); H01L 21/67028 (2013.01); H01L 21/67051 (2013.01); H01L 21/67253 (2013.01)
(58) Field of Classification Search
CPC ................... H01L 21/67034; H01L 21/02057
See application file for complete search history.

(56) References Cited

U.S. PATENT DOCUMENTS

| 2005/0145267 A1* | 7/2005 | Korolik ............. H01L 21/67028 134/30 |
| 2007/0017555 A1 | 1/2007 | Sekiguchi et al. ............... 134/33 |
| 2014/0065295 A1 | 3/2014 | Emoto et al. ...................... 427/8 |
| 2019/0067045 A1* | 2/2019 | Hinode ............. H01L 21/67034 |
| 2019/0067046 A1* | 2/2019 | Hinode ............. H01L 21/02057 |

FOREIGN PATENT DOCUMENTS

| JP | 2012-222329 A | 11/2012 |
| JP | 2014-197571 A | 10/2014 |
| JP | 2016-021597 A | 2/2016 |
| KR | 10-2007-0062457 A | 6/2007 |
| KR | 10-2014-0046527 A | 4/2014 |

* cited by examiner

Primary Examiner — Sharidan Carrillo
(74) Attorney, Agent, or Firm — Ostrolenk Faber LLP

(57) ABSTRACT

A substrate processing method includes a substrate holding step of holding a substrate horizontally, a hydrophobic agent supplying step of supplying to an upper surface of the substrate a hydrophobic agent which is a liquid for hydrophobizing the upper surface of the substrate, a low surface-tension liquid supplying step of supplying the low surface-tension liquid to the upper surface of the substrate in order to replace the hydrophobic agent on the substrate by a low surface-tension liquid lower in surface tension than water, and a humidity adjusting step of adjusting humidity of the atmosphere in contact with a liquid film on the substrate such that the humidity of the atmosphere in contact with a liquid film on the substrate in the hydrophobic agent supplying step reaches a first humidity and the humidity of the atmosphere in contact with a liquid film on the substrate in the low surface-tension liquid supplying step reaches a second humidity which is humidity lower than the first humidity.

11 Claims, 27 Drawing Sheets

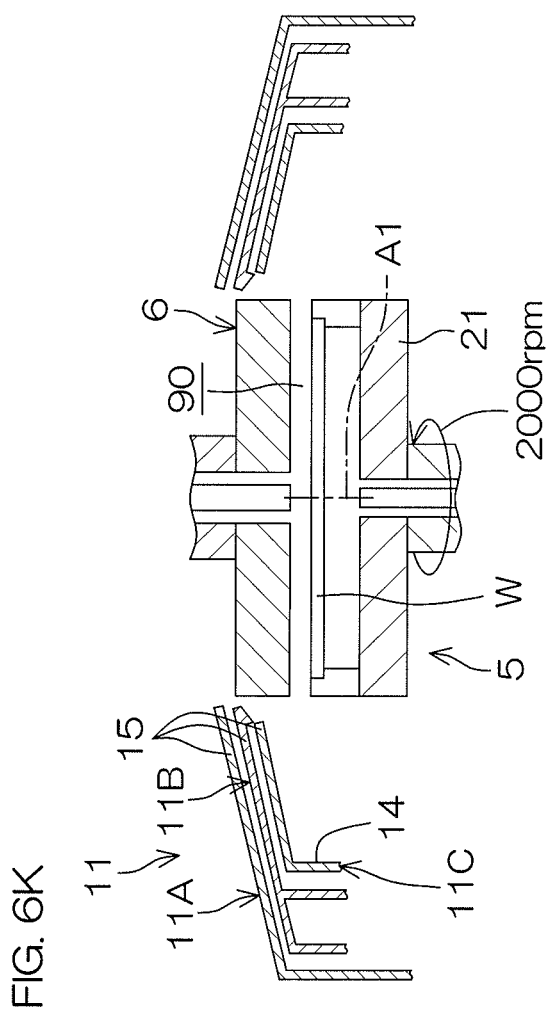

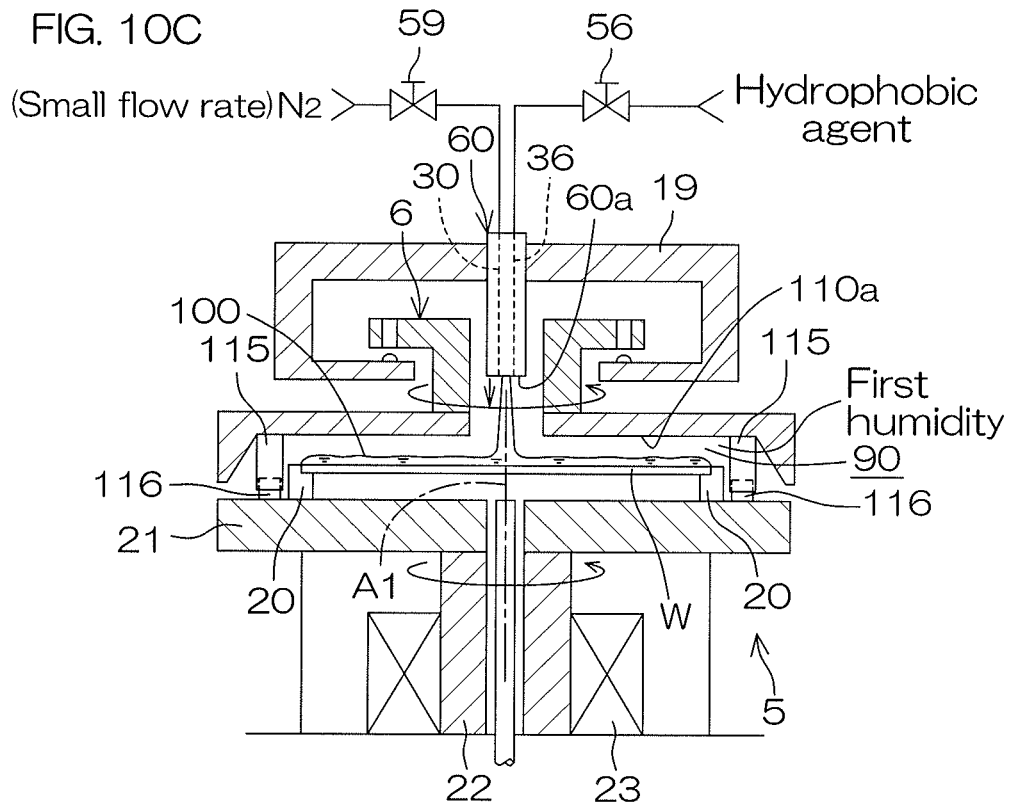
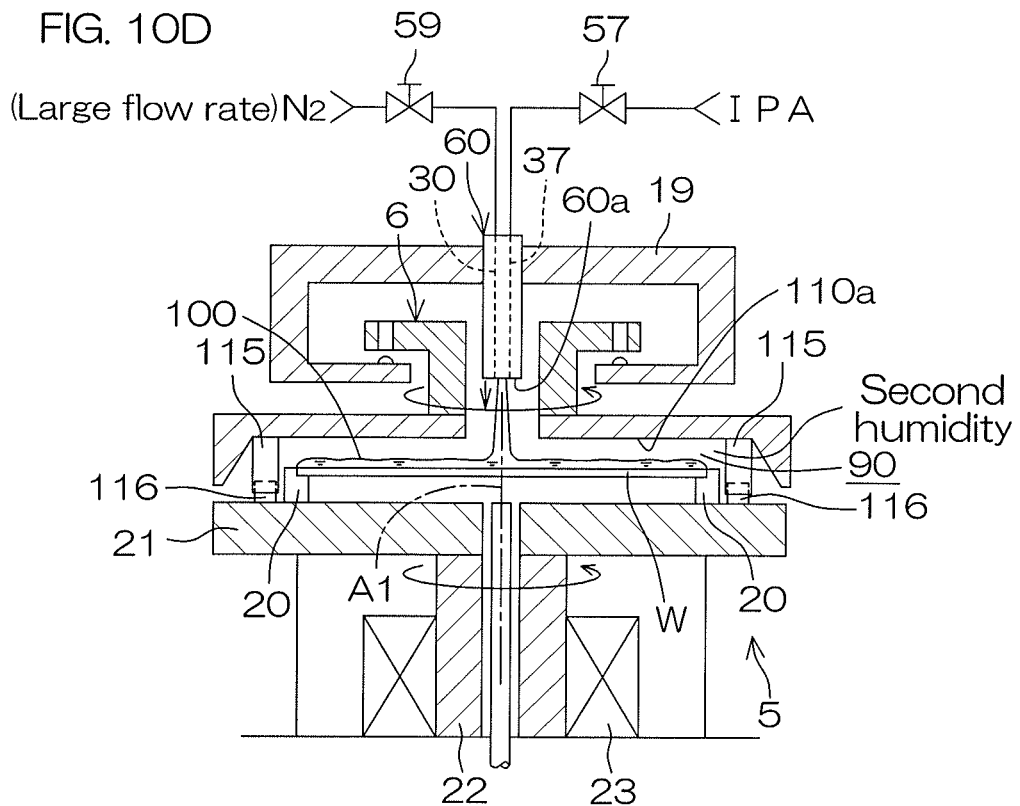

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing substrates. Examples of substrates to be processed include substrates such as semiconductor wafers, substrates for liquid crystal displays, substrates for FPDs (Flat Panel Displays) such as organic ELs (Electroluminescence), substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus, substrates are processed one at a time. In detail, a substrate is held substantially horizontally by a spin chuck. Then, after processing of an upper surface of the substrate by a chemical liquid, the upper surface of the substrate is rinsed by a rinse liquid. Thereafter, a spin drying step is executed in which the substrate is rotated at a high speed for drying the upper surface of the substrate.

As shown in FIG. 14, where a fine pattern is formed on a front surface of a substrate, in the spin drying step, it may not be possible to favorably dry a rinse liquid which has entered into an interior of the pattern. Drying failure may occur thereby. A liquid surface (interface between air and liquid) of the rinse liquid that entered into an interior of the pattern is formed inside the pattern. Therefore, a surface tension of the liquid acts on a position at which the liquid surface is in contact with the pattern. Where the surface tension is large, the pattern may easily collapse. Since water that is a typical example of the rinse liquid is large in surface tension, collapse of a pattern cannot be ignored in the spin drying step.

Thus, there has been proposed a method for using isopropyl alcohol (IPA) which is a low surface-tension liquid lower in surface tension than water (refer to, for example, Japanese Patent Application Publication No. 2016-21597). Specifically, IPA is supplied to an upper surface of a substrate to replace water entered into an interior of a pattern by IPA and remove IPA thereafter, thereby drying the upper surface of the substrate. However, even where water that entered into the interior of the pattern is replaced by IPA, collapse of the pattern may occur, if a surface tension acts thereon for a longer time or the pattern is low in strength.

Thus, Japanese Patent Application Publication No. 2012-222329 has disclosed substrate processing by which an upper surface of a substrate is hydrophobized by a silylating agent (hydrophobic agent) to lower a surface tension applied to a pattern, thereby preventing collapse of the pattern. Specifically, a silylating agent is supplied to an upper surface of a substrate and the silylating agent supplied to the upper surface of the substrate flows so as to spread from a center of the upper surface of the substrate to a peripheral edge thereof due to rotation of the substrate. Thereby, the upper surface of substrate in its entirety is hydrophobized. Thereafter, the silylating agent that remains on the upper surface of the substrate is washed away by IPA and the substrate is then dried.

SUMMARY OF THE INVENTION

When the atmosphere in contact with a silylating agent on a substrate is high in humidity, before reactions with an upper surface of the substrate, a polymerization reaction of the silylating agent proceeds and the silylating agent is polymerized. Thereby, the upper surface of the substrate may not be sufficiently hydrophobized. Further, particles may be generated due to precipitation of the polymer.

In contrast, when the atmosphere in contact with a silylating agent on a substrate is low in humidity, the silylating agent hardly undergoes polymerization and a large amount of unreacted silylating agent may remain on the substrate, even after an upper surface of the substrate has been sufficiently hydrophobized. The unreacted silylating agent may adhere to the upper surface of the substrate to produce particles.

On the other hand, when the atmosphere in contact with a low surface-tension liquid on a substrate is high in humidity, the amount of water which dissolves into a liquid film of the low surface-tension liquid on the substrate may be increased to raise the surface tension.

In the substrate processing described in Japanese Patent Application Publication No. 2012-222329, humidity of the atmosphere in contact with a silylating agent on a substrate is not controlled. Therefore, the upper surface of the substrate may not be sufficiently hydrophobized due to high humidity or particles may be generated due to low humidity. In this case, the upper surface of the substrate cannot be satisfactorily dried.

Thus, an object of the present invention is to provide a substrate processing method and a substrate processing apparatus with which an upper surface of a substrate can be satisfactorily dried.

A preferred embodiment of the present invention provides a substrate processing method which includes a substrate holding step of holding a substrate horizontally, a hydrophobic agent supplying step of supplying to an upper surface of the substrate a hydrophobic agent which is a liquid for hydrophobizing the upper surface of the substrate, a low surface-tension liquid supplying step of supplying a low surface-tension liquid to the upper surface of the substrate in order to replace the hydrophobic agent on the substrate by the low surface-tension liquid lower in surface tension than water, and a humidity adjusting step of adjusting humidity of the atmosphere in contact with a liquid film on the substrate such that the humidity of the atmosphere in contact with a liquid film on the substrate in the hydrophobic agent supplying step reaches a first humidity and the humidity of the atmosphere in contact with a liquid film on the substrate in the low surface-tension liquid supplying step reaches a second humidity which is lower in humidity than the first humidity.

According to the above-described method, the humidity of the atmosphere in contact with a liquid film on the substrate in the hydrophobic agent supplying step is made higher than the humidity of the atmosphere in contact with a liquid film on the substrate in the low surface-tension liquid supplying step.

Therefore, in the hydrophobic agent supplying step, the atmosphere in contact with a liquid film on the substrate can be increased in humidity to such an extent that polymerization of the hydrophobic agent will not proceed excessively. Consequently, the hydrophobic agent is suppressed from being polymerized, so that the hydrophobic agent can undergo appropriate polymerization. As a result, it is possible to suppress the generation of particles while making the upper surface of the substrate sufficiently hydrophobic.

Further, in the low surface-tension liquid supplying step, the humidity of the atmosphere in contact with a liquid film on the substrate can be decreased sufficiently. Thereby, it is possible to reduce the amount of water contained in a liquid film of the low surface-tension liquid on the substrate. Therefore, it is possible to lower a surface tension of the low surface-tension liquid on the substrate which is applied to the upper surface of the substrate.

If the humidity of the atmosphere in contact with a liquid film on the substrate is kept at the first humidity in at least part of the period of time during which the hydrophobic agent supplying step is executed, the humidity of the atmosphere in contact with a liquid film on the substrate may not be kept at the first humidity throughout the hydrophobic agent supplying step. Similarly, if the humidity of the atmosphere in contact with a liquid film on the substrate is kept at the second humidity in at least part of the period of time during which the low surface-tension liquid supplying step is executed, the humidity of the atmosphere in contact with a liquid film on the substrate may not be kept at the second humidity throughout the low surface-tension liquid supplying step. This is also applicable to a third humidity which will be described later.

In a preferred embodiment of the present invention, the substrate processing method further includes an organic solvent supplying step in which an organic solvent which is mixed with water and the hydrophobic agent is supplied to the upper surface of the substrate, before the hydrophobic agent supplying step. Then, the humidity adjusting step includes a step in which the humidity of the atmosphere in contact with a liquid film on the substrate is adjusted such that the humidity of the atmosphere in contact with a liquid film on the substrate in the organic solvent supplying step reaches a third humidity which is humidity lower than the first humidity.

If water is contained in an organic solvent on a substrate, when the organic solvent on a substrate is replaced by a hydrophobic agent in the hydrophobic agent supplying step, the hydrophobic agent reacts with water in the organic solvent. Consequently, a polymerization reaction of the hydrophobic agent proceeds and the upper surface of the substrate may not be sufficiently hydrophobized. Thus, in such a configuration that in the organic solvent supplying step, the humidity of the atmosphere in contact with a liquid film on the substrate is made lower than the first humidity, it is possible to suppress the hydrophobic agent from being polymerized. Thereby, it is possible to further suppress the generation of particles while making the upper surface of the substrate more sufficiently hydrophobic.

In a preferred embodiment of the present invention, the substrate processing method further includes a gas supplying step in which a gas is supplied toward a space between a facing surface (the surface which faces the upper surface of the substrate) of a facing member and the upper surface of the substrate. Then, the humidity adjusting step includes a step of adjusting humidity inside the space such that the humidity of the space in the hydrophobic agent supplying step reaches the first humidity and the humidity of the space in the low surface-tension liquid supplying step reaches the second humidity during execution of the gas supplying step.

According to the above-described method, a gas is supplied to the space between the facing surface of the facing member and the upper surface of the substrate, thereby adjusting the humidity of the space between the facing surface of the facing member and the upper surface of the substrate. The humidity of the space between the facing surface of the facing member and the upper surface of the substrate can be adjusted, thereby easily adjusting the humidity of the atmosphere in contact with a liquid film on the substrate.

In a preferred embodiment of the present invention, the humidity adjusting step includes a step in which a distance between the facing surface and the upper surface of the substrate is changed from a first distance which is a distance between the facing surface and the upper surface of the substrate in the hydrophobic agent supplying step to a second distance which is smaller than the first distance, thereby changing the humidity of the atmosphere in contact with a liquid film on the substrate from the first humidity to the second humidity.

In the hydrophobic agent supplying step, the hydrophobic agent supplied to the upper surface of the substrate may be adhered to the facing surface by being splashed back from the upper surface of the substrate. If the hydrophobic agent adhered to the facing surface drops on the upper surface of the substrate in the low surface-tension liquid supplying step after the hydrophobic agent supplying step, it may cause the generation of particles.

Thus, according to a method in which a distance between the facing surface and the upper surface of the substrate is changed from the first distance to the second distance which is smaller than the first distance to adjust the humidity inside the space between the facing surface and the upper surface of the substrate, in the hydrophobic agent supplying step, the hydrophobic agent is supplied to the upper surface of the substrate in a state that the facing member is relatively separated from the upper surface of the substrate. It is, therefore, possible to suppress the hydrophobic agent from being adhered to the facing surface and also to suppress the generation of particles.

In a preferred embodiment of the present invention, the step which changes the humidity of the atmosphere in contact with a liquid film on the substrate from the first humidity to the second humidity includes a step in which, during execution of the low surface-tension liquid supplying step, a distance between the facing surface and the upper surface of the substrate from the first distance to the second distance is changed.

Therefore, at least after the start of replacing the hydrophobic agent on the upper surface of the substrate by the low surface-tension liquid, a distance between the facing surface and the upper surface of the substrate is changed to the second distance. Consequently, it is possible to further suppress the hydrophobic agent from being adhered to the facing surface.

In a preferred embodiment of the present invention, the humidity adjusting step includes a step in which a supply flow rate of the gas is adjusted, thereby adjusting the humidity inside the space. Therefore, the humidity of the space between the facing surface and the upper surface of the substrate can be adjusted with high accuracy by changing a distance between the facing surface and the upper surface of the substrate and adjusting a supply flow rate of the gas. Consequently, it is possible to adjust with high accuracy the humidity inside the space between the facing surface and the upper surface of the substrate.

In a preferred embodiment of the present invention, the humidity adjusting step includes a step in which a supply flow rate of the gas is adjusted while a distance between the facing surface and the upper surface of the substrate is kept constant, thereby adjusting the humidity inside the space. Therefore, even in such a configuration that the facing member cannot be moved up and down in the hydrophobic agent supplying step or the low surface-tension liquid supplying step, it is possible to adjust with high accuracy the humidity of the space between the facing surface and the upper surface of the substrate.

In a preferred embodiment of the present invention, the substrate processing method further includes an evacuating step of evacuating the atmosphere around the upper surface of the substrate. Further, the humidity adjusting step includes a step in which, the atmosphere evacuated in the evacuating step is adjusted for a flow rate, thereby adjusting the humidity of the atmosphere in contact with a liquid film of the substrate.

In a preferred embodiment of the present invention, the substrate processing method further includes a substrate rotating step of rotating the substrate around a vertical rotation axis which passes through a central portion of the substrate and a substrate drying step in which the substrate is rotated to remove the low surface-tension liquid on the substrate, thereby drying the substrate. Therefore, it is possible to quickly remove the low surface-tension liquid on the substrate. Consequently, it is possible to reduce the time that the low surface-tension liquid applies a surface tension to the upper surface of the substrate.

The other preferred embodiment of the present invention provides a substrate processing apparatus which includes a substrate holding unit which holds a substrate horizontally, a hydrophobic agent supplying unit which supplies to an upper surface of the substrate a hydrophobic agent which is a liquid for hydrophobizing the upper surface of the substrate, a low surface-tension liquid supplying unit which supplies to the upper surface of the substrate a low surface-tension liquid lower in surface tension than water, a humidity adjusting unit of adjusting humidity of the atmosphere in the vicinity of the upper surface of the substrate, and a controller which controls the hydrophobic agent supplying unit, the low surface-tension liquid supplying unit and the humidity adjusting unit. And, the controller is programmed so as to execute a hydrophobic agent supplying step of supplying the hydrophobic agent from the hydrophobic agent supplying unit to the upper surface of the substrate, a low surface-tension liquid supplying step of supplying the low surface-tension liquid from the low surface-tension liquid supplying unit to the upper surface of the substrate in order to replace the hydrophobic agent on the substrate by the low surface-tension liquid, and a humidity adjusting step of adjusting the humidity of the atmosphere in contact with a liquid film on the substrate by the humidity adjusting unit such that the humidity of the atmosphere in contact with a liquid film on the substrate in the hydrophobic agent supplying step reaches a first humidity and also the humidity of the atmosphere in contact with a liquid film on the substrate in the low surface-tension liquid supplying step reaches a second humidity which is humidity lower than the first humidity.

According to the above-described configuration, the humidity of the atmosphere in contact with a liquid film on the substrate in the hydrophobic agent supplying step is made higher than the humidity of the atmosphere in contact with a liquid film on the substrate in the low surface-tension liquid supplying step.

Therefore, in the hydrophobic agent supplying step, the humidity of the atmosphere in contact with a liquid film on the substrate can be increased to such an extent that polymerization of the hydrophobic agent will not proceed excessively. Consequently, the hydrophobic agent is allowed to undergo polymerization appropriately by suppressing the hydrophobic agent from being polymerized. As a result, it is possible to suppress the generation of particles while making the upper surface of the substrate sufficiently hydrophobic.

Further, in the low surface-tension liquid supplying step, the humidity of the atmosphere in contact with a liquid film on the substrate can be sufficiently decreased. Thereby, it is possible to reduce the amount of water contained in a liquid film of the low surface-tension liquid on the substrate. Therefore, it is possible to lower a surface tension of the low surface-tension liquid on the substrate which is applied to the upper surface of the substrate.

In the other preferred embodiment of the present invention, the substrate processing apparatus further includes an organic solvent supplying unit which supplies to the upper surface of the substrate an organic solvent which is miscible with water and the hydrophobic agent. The controller executes, before the hydrophobic agent supplying step, an organic solvent supplying step of supplying the organic solvent from the organic solvent supplying unit to the upper surface of the substrate, and the controller is programmed so as to execute, in the humidity adjusting step, a step in which the humidity of the atmosphere in contact with a liquid film on the substrate is adjusted such that the humidity of the atmosphere in the vicinity of the upper surface of the substrate in the organic solvent supplying step reaches a third humidity which is humidity lower than the first humidity.

If water is contained in an organic solvent on a substrate, when the organic solvent on the substrate is replaced by a hydrophobic agent in the hydrophobic agent supplying step, the hydrophobic agent reacts with water in the organic solvent. Consequently, a polymerization reaction of the hydrophobic agent proceeds and the upper surface of the substrate may not be sufficiently hydrophobized. Thus, in such a configuration that the humidity of the atmosphere in contact with a liquid film on the substrate is made lower than the first humidity in the organic solvent supplying step, it is possible to suppress the hydrophobic agent from being polymerized. As a result, it is possible to further suppress the generation of particles while making the upper surface of the substrate more sufficiently hydrophobic.

In the other preferred embodiment of the present invention, the substrate processing apparatus further includes a facing member having a facing surface which faces the upper surface of the substrate and a gas supplying unit which supplies a gas to a space between the facing surface and the upper surface of the substrate. The controller is programmed so as to execute a gas supplying step of supplying a gas from the gas supplying unit toward the space. The controller is programmed so as to execute, in the humidity adjusting step, a step which adjusts the humidity inside the space such that the humidity of the space in the hydrophobic agent supplying step reaches the first humidity and the humidity of the space in the low surface-tension liquid supplying step reaches the second humidity during execution of the gas supplying step.

According to the above-described configuration, a gas is supplied to the space between the facing surface of the facing member and the upper surface of the substrate, thereby adjusting the humidity of the space between the facing surface of the facing member and the upper surface of the substrate. The humidity of the space between the facing surface of the facing member and the upper surface of the substrate can be adjusted, thereby easily adjusting the humidity of the atmosphere in contact with a liquid film on the substrate.

In the other preferred embodiment of the present invention, the substrate processing apparatus further includes a facing member raising/lowering unit which raises and lowers the facing member. Further, the controller is programmed so as to execute, in the humidity adjusting step, a step in which the facing member is raised and lowered by the facing member raising/lowering unit, thereby changing a distance between the facing surface and the upper surface of the substrate from a first distance which is a distance between the facing surface and the upper surface of the substrate in the hydrophobic agent supplying step to a second distance smaller than the first distance, thereby changing the humidity of the atmosphere in contact with a liquid film on the substrate from the first humidity to the second humidity.

The hydrophobic agent supplied to the upper surface of the substrate in the hydrophobic agent supplying step may be adhered to the facing surface by being splashed back from the upper surface of the substrate. If the hydrophobic agent adhered to the facing surface drops on the upper surface of the substrate in the low surface-tension liquid supplying step after the hydrophobic agent supplying step, it may cause the generation of particles.

Thus, according to a method for adjusting the humidity inside the space by changing a distance between the facing surface and the upper surface of the substrate from the first distance to the second distance which is smaller than the first distance, in the hydrophobic agent supplying step, in a state that the facing member is relatively separated from the upper surface of the substrate, the hydrophobic agent is supplied to the upper surface of the substrate. Therefore, it is possible to suppress the hydrophobic agent from being adhered to the facing surface and also suppress the generation of particles.

In the other preferred embodiment of the present invention, the controller is programmed so as to execute, in a step in which the humidity of the atmosphere in contact with a liquid film of the substrate is changed from the first humidity to the second humidity, a step in which, during execution of the low surface-tension liquid supplying step, the facing member is raised and lowered by the facing member raising/lowering unit to change a distance between the facing surface and the upper surface of the substrate from the first distance to the second distance.

Therefore, at least when the hydrophobic agent on the upper surface of the substrate starts to be replaced by the low surface-tension liquid, a distance between the facing surface and the upper surface of the substrate is changed to the second distance. Consequently, it is possible to further suppress the hydrophobic agent from being adhered to the facing surface.

In the other preferred embodiment of the present invention, the gas supplying unit adjusts a flow rate of the gas supplied to the space, and the controller is programmed so as to execute, in the humidity adjusting step, a step in which a supply flow rate of the gas from the gas supplying unit is adjusted, thereby adjusting the humidity inside the space. Therefore, the humidity of the space between the facing surface and the upper surface of the substrate can be adjusted with high accuracy by changing a distance between the facing surface and the upper surface of the substrate and adjusting a supply flow rate of the gas. Consequently, it is possible to adjust the humidity of the atmosphere in contact with a liquid film on the substrate with high accuracy.

In the other preferred embodiment of the present invention, the gas supplying unit adjusts a flow rate of the gas which is supplied to the space. The controller is programmed so as to execute, in the humidity adjusting step, a step in which, while a distance between the facing surface and the upper surface of the substrate is kept constant, a supply flow rate of the gas from the gas supplying unit is adjusted, thereby adjusting the humidity inside the space. Therefore, even in such a configuration that the facing member cannot be moved up and down in the hydrophobic agent supplying step or the low surface-tension liquid supplying step, it is possible to adjust with high accuracy the humidity of the space between the facing surface and the upper surface of the substrate.

In the other preferred embodiment of the present invention, the substrate processing apparatus further includes an evacuating unit which evacuates the atmosphere above the substrate to adjust an evacuation flow rate. The controller is programmed so as to execute, in the humidity adjusting step, a step in which the evacuation flow rate is adjusted by the evacuating unit, thereby adjusting the humidity of the atmosphere in contact with a liquid film on the substrate.

In the other preferred embodiment of the present invention, the substrate processing apparatus further includes a substrate rotating unit which rotates the substrate around a vertical rotation axis passing through a central portion of the substrate. The controller is programmed so as to execute a substrate drying step in which the substrate is rotated by the substrate rotating unit to remove the low surface-tension liquid on the substrate, thereby drying the substrate. Therefore, the low surface-tension liquid on the substrate can be quickly removed. Consequently, it is possible to reduce the time that a surface tension of the low surface-tension liquid is applied to the upper surface of the substrate.

The above and other objects, features, and effects of the present invention will become more apparent from the following detailed description of the preferred embodiments with reference to the attached drawings.

BRIEF DESCRIPTION OF THE DRAWINGS

FIG. 6A to FIG. 6K are each an illustrative sectional view for describing one example of the substrate processing.

FIG. 10A to FIG. 10D are each an illustrative sectional view for describing one example of substrate processing by the substrate processing apparatus according to the second preferred embodiment.

DETAILED DESCRIPTION OF THE PREFERRED EMBODIMENTS

First Preferred Embodiment

Figure 1:
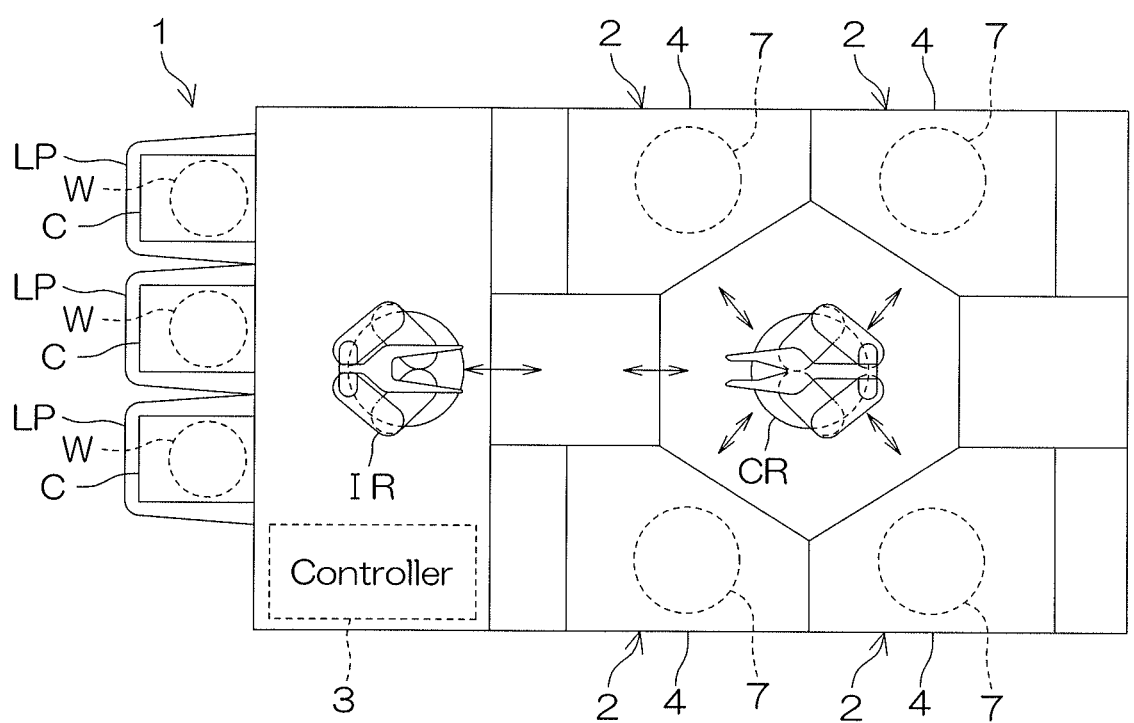
FIG. 1 is a plan view for describing a configuration of a substrate processing apparatus according to a first preferred embodiment of the present invention.

FIG. 1 is an illustrative plan view for describing an internal layout of a substrate processing apparatus 1 according to a first preferred embodiment of the present invention.

The substrate processing apparatus 1 is a single substrate processing type apparatus which processes substrates W such as silicon wafers, etc., one at a time. In this preferred embodiment, a substrate W is a disk-shaped substrate. The substrate processing apparatus 1 includes a plurality of processing units 2 which process substrates W with a processing liquid, a load port LP in each of which a carrier C, that houses the plurality of substrates W to be processed by the processing unit 2, is placed, transfer robots IR and CR which transfer the substrate W between the load port LP and the processing unit 2, and a controller 3 which controls the substrate processing apparatus 1. The processing liquid includes a chemical liquid, a rinse liquid, an organic solvent, a hydrophobic agent, etc., that will be described later. The transfer robot IR transfers a substrate W between the carrier C and the transfer robot CR. The transfer robot CR transfers a substrate W between the transfer robot IR and the processing unit 2. The plurality of processing units 2 are similar in configuration, for example.

Figure 2:
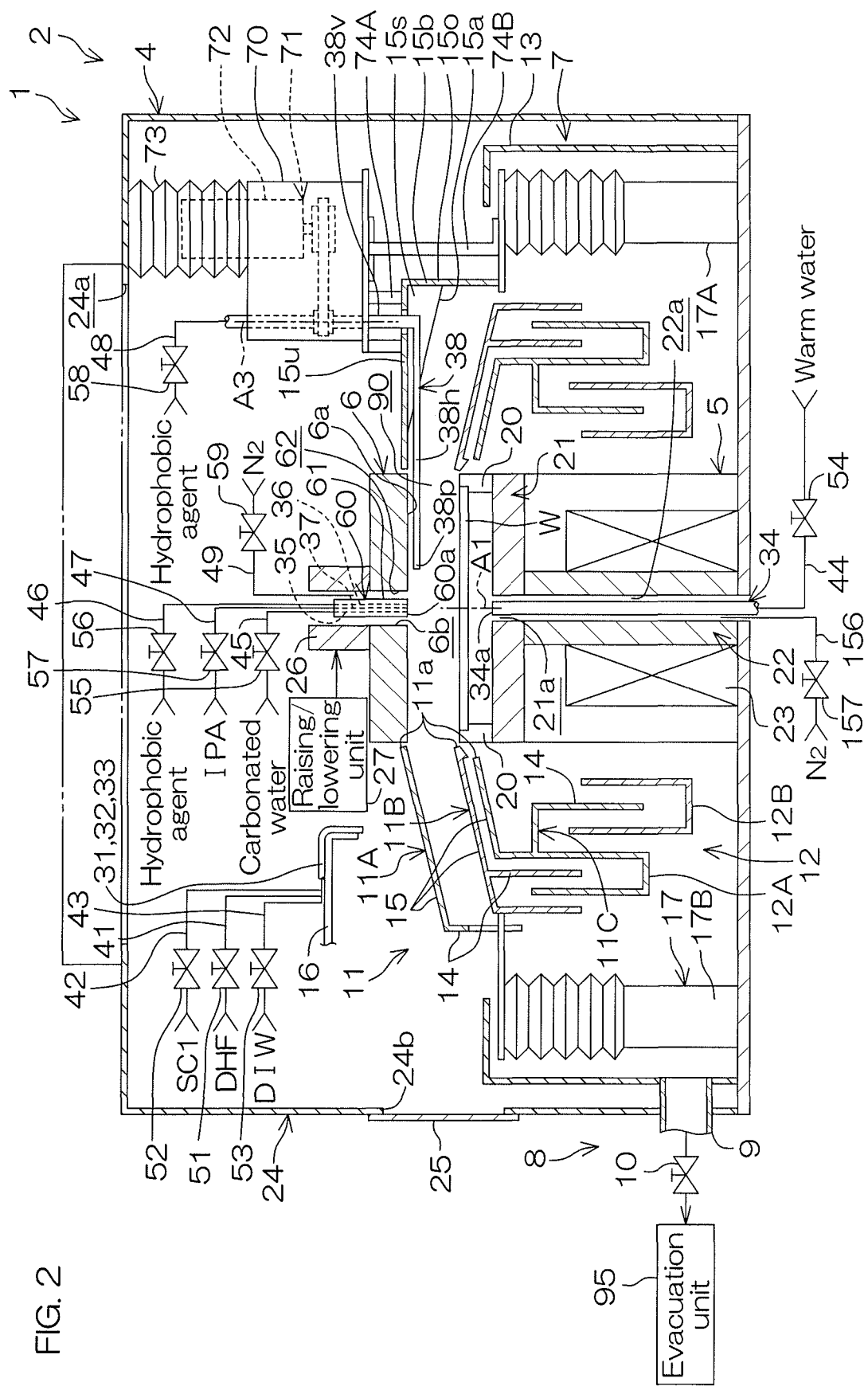
FIG. 2 is an illustrative sectional view for describing an example of configuration of a processing unit included in the substrate processing apparatus.

FIG. 2 is a schematic view for describing an example of configuration of the processing unit 2. The processing unit 2 includes a box-shaped chamber 4, a spin chuck 5, a facing member 6, a tubular processing cup 7 and an evacuating unit 8. The chamber 4 has an internal space. The spin chuck 5 rotates a substrate W around a vertical rotation axis A1, while holding it horizontally inside the chamber 4. The rotation axis A1 passes through a central portion of the substrate W. The facing member 6 faces an upper surface of the substrate held by the spin chuck 5. The processing cup 7 receives a processing liquid which is scattered outside from the substrate W. The evacuating unit 8 evacuates the atmosphere inside the chamber 4.

The chamber 4 includes a box-shaped partition wall 24 having a carry in/out port 24b through which a substrate W passes and a shutter 25 which opens and closes the carry in/out port 24b. Clean air, or air which is filtered, is constantly supplied into the chamber 4 from a ventilation port 24a provided above the partition wall 24.

The evacuating unit 8 includes an evacuating duct 9 connected to a bottom portion of the processing cup 7 and an evacuating valve 10 which opens and closes the evacuating duct 9. The opening degree of the evacuating valve 10 can be adjusted, thereby adjusting a flow rate (evacuation flow rate) of a gas which flows through the evacuating duct 9. The evacuating duct 9 is, for example, connected to an evacuation unit 95 which suctions the interior of the chamber 4. The evacuation unit 95 may be a part of the substrate processing apparatus 1 or may be separately provided from the substrate processing apparatus 1. Where the evacuation unit 95 is apart of the substrate processing apparatus 1, the evacuation unit 95 is, for example, a vacuum pump, etc. A gas in the chamber 4 is drained from the chamber 4 via the evacuating duct 9. Thereby, a downflow of the clean air is constantly formed inside the chamber 4.

While holding a single substrate W in a horizontal posture, the spin chuck 5 rotates the substrate W around the vertical rotation axis A1 passing through a central portion of the substrate W. The spin chuck 5 is included in the substrate holding unit which holds the substrate W horizontally. The substrate holding unit is also referred to as a substrate holder. The spin chuck 5 includes a chuck pin 20, a spin base 21, a rotating shaft 22 and a spin motor 23.

The spin base 21 has a disk shape along a horizontal direction. On the upper surface of the spin base 21, the plurality of chuck pins 20 are disposed at intervals in a circumferential direction. The spin chuck 5 is not limited to a clamping type chuck by which the plurality of chuck pins 20 are brought into contact with an outer circumferential surface of the substrate W. For example, the spin chuck 5 may be a vacuum type chuck which holds the substrate W horizontally by adsorbing a rear surface (lower surface) of the substrate W which is a non-device forming surface to an upper surface of the spin base 21.

The rotating shaft 22 extends in a vertical direction along the rotation axis A1. An upper end portion of the rotating shaft 22 is coupled to a lower surface center of the spin base 21. A penetrating hole 21a which penetrates through the spin base 21 in an up/down direction is formed at a central region of the spin base 21 in a plan view. The penetrating hole 21a is communicatively connected with an internal space 22a of the rotating shaft 22.

The spin motor 23 applies a rotating force to the rotating shaft 22. The rotating shaft 22 is rotated by the spin motor 23 to rotate the spin base 21. Thereby, a substrate W is rotated around the rotation axis A1. In the following description, an inner side in a radius direction at the center of the rotation axis A1 shall be simply referred to as the "radially inner side" and an outer side in the radius direction at the center of the rotation axis A1 shall be simply referred to as "radially outer side." The spin motor 23 is included in the substrate rotating unit which rotates the substrate W around the rotation axis A1.

The facing member 6 is formed in a disk shape so as to have a diameter substantially equal to or larger than that of a substrate W and disposed substantially horizontally above the spin chuck 5. The facing member 6 is also referred to as a blocking member. The facing member 6 has a facing surface 6a which faces an upper surface of the substrate W. A hollow shaft 26 is fixed to a surface on the opposite side of the facing surface 6a of the facing member 6. A communication hole which is communicated with an internal space of the hollow shaft 26 and penetrates through the facing member 6 in the up/down direction is formed at a portion of the facing member 6 which includes a position that overlaps the rotation axis A1 in a plan view.

The processing unit 2 further includes a facing member raising/lowering unit 27 which drives raising/lowering of the facing member 6. The facing member raising/lowering unit 27 is able to position the facing member 6 at any given position (height) from a lower position (a position shown in FIG. 6K which will be described later) to an upper position (a position shown in FIG. 6A which will be described later). The lower position is a position at which the facing surface 6a of the facing member 6 comes closest to a substrate W in a movable range of the facing member 6. The upper position is a position at which the facing surface 6a of the facing member 6 is separated most from the substrate W in a movable range of the facing member 6. The facing member raising/lowering unit 27 includes, for example, a ball screw mechanism (not shown) and an electric motor (not shown) which applies a driving force thereto.

The processing cup 7 includes a plurality of guards 11 for receiving a liquid scattered outward from a substrate W held by the spin chuck 5, a plurality of cups 12 for receiving the liquid guided downward by the plurality of guards 11, and a cylindrical outer wall member 13 which surrounds the plurality of guards 11 and the plurality of cups 12. FIG. 2 shows an example in which there are provided three guards 11 (outer guard 11A, center guard 11B, inner guard 11C) and two cups 12 (first cup 12A, second cup 12B).

Where the outer guard 11A, the center guard 11B and the inner guard 11C are each referred, they may be hereinafter simply referred to as a guard 11 from time to time. Similarly, where the first cup 12A and the second cup 12B are each referred, they may be simply referred to as a cup 12 from time to time.

Each of the guards 11 surrounds a substrate W in a plan view and receives a liquid scattered from the substrate W. Each of the guards 11 includes a cylindrical tubular portion 14 which surrounds the spin chuck 5 and a circular-annular extension portion 15 which extends obliquely upward from an upper end of the tubular portion 14 toward the rotation axis A1 (facing member 6). The tubular portion 14 of the inner guard 11C, that of the center guard 11B and that of the outer guard 11A are disposed concentrically in this order from the radially inner side. The extension portion 15 of the inner guard 11C, that of the center guard 11B and that of the outer guard 11A overlap each other in this order from below in the up/down direction. An upper end of the extension portion 15 of the inner guard 11C corresponds to an upper end 11a of the inner guard 11C. An upper end of the extension portion 15 of the center guard 11B corresponds to an upper end 11a of the center guard 11B. An upper end of the extension portion 15 of the outer guard 11A corresponds to an upper end 11a of the outer guard 11A. The upper end 11a of each of the guards 11 surrounds the spin base 21 and the facing member 6 in a plan view.

The plurality of cups 12 are concentrically disposed sequentially from the first cup 12A to the second cup 12B from outside. The first cup 12A surrounds the spin chuck 5. The second cup 12B surrounds the spin chuck 5 further inside than the first cup 12A. The second cup 12B is disposed further below than the upper end of the outer wall member 13. The second cup 12B is fixed to the partition wall 24 of the chamber 4. The first cup 12A is formed integrally with the center guard 11B and moves up and down together with the center guard 11B. The center guard 11B may be able to move in relation to the first cup 12A.

The guard 11 is able to move up and down between the upper position and the lower position. When the guard 11 is positioned at the upper position, the upper end 11a of the guard 11 is positioned higher than an upper surface of a substrate W held by the spin chuck 5. When the guard 11 is positioned at the lower position, the upper end 11a of the guard 11 is positioned lower than the upper surface of the substrate W held by the spin chuck 5.

Figure 3:
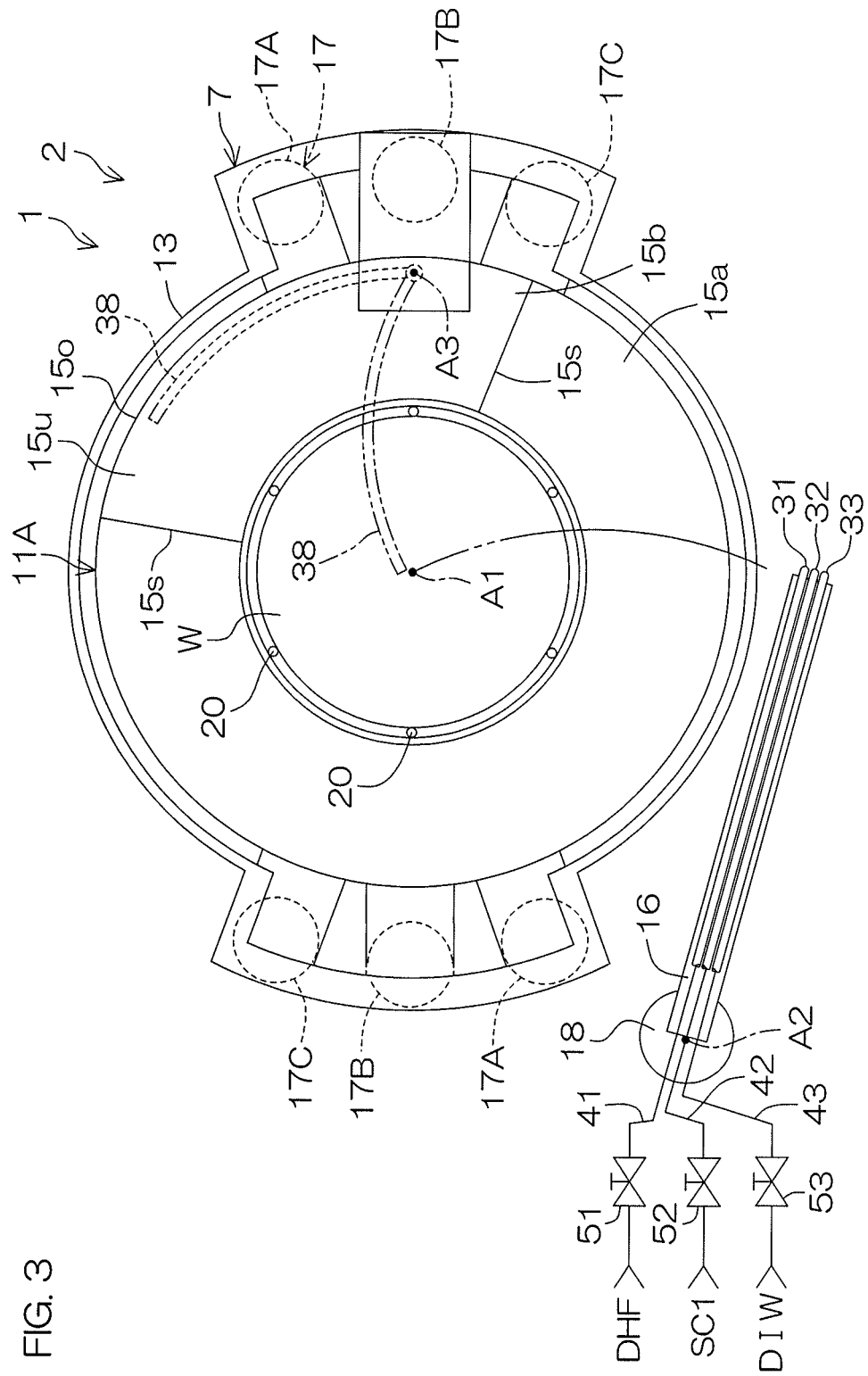
FIG. 3 is a plan view of a spin chuck and members in a vicinity of the spin chuck included in the processing unit.

The processing unit 2 further includes a guard raising/lowering unit 17 which drives raising/lowering of the plurality of guards 11. FIG. 3 is a plan view which shows the spin chuck 5 and members in the vicinity thereof. With reference to FIG. 3, the guard raising/lowering unit 17 includes a pair of outer guard raising/lowering units 17A, a pair of center guard raising/lowering units 17B and a pair of inner guard raising/lowering units 17C. In detail, a set composed of the outer guard raising/lowering unit 17A, the center guard raising/lowering unit 17B and the inner guard raising/lowering unit 17C is disposed in pairs so as to be point-symmetrical at the center of the rotation axis A1 of the substrate W in a plan view. It is, therefore, possible to stably raise and lower each of the plurality of guards 11.

Each of the outer guard raising/lowering units 17A includes an electric motor (not shown) which generates power and a ball screw mechanism which converts the rotation of the electric motor (not shown) to movement of the outer guard 11A in the up/down direction. Each of the center guard raising/lowering units 17B includes an electric motor (not shown) which generates power and a ball screw mechanism which converts the rotation of the electric motor (not shown) to movement of the center guard 11B in the up/down direction. Each of the inner guard raising/lowering units 17C includes an electric motor (not shown) which generates power and a ball screw mechanism which converts the rotation of the electric motor (not shown) to movement of the inner guard 11C in the up/down direction.

The guard raising/lowering unit 17 is an example of a guard switching unit which switches a state of the plurality of guards 11 by allowing at least one of the plurality of guards 11 to move up and down. The guard raising/lowering unit 17 positions each of the guards 11 at any given position from the upper position to the lower position. Thereby, a state (position) of the plurality of guards 11 is switched. The guard raising/lowering unit 17 sets the plurality of guards 11, for example, to any one of three states (a first state, a second state and a third state).

The "first state" (a state shown in FIG. 6F which will be described later) is a state of the plurality of guards 11 when the outer guard 11A receives a liquid scattered from a substrate W. When a state of the plurality of guards 11 is the first state, the outer guard 11A is positioned at the upper position, and the inner guard 11C and the center guard 11B are positioned at the lower position.

The "second state" (a state shown in FIG. 6E which will be described later) is a state of the plurality of guards when the inner guard 11C receives a liquid scattered from a substrate W. When a state of the plurality of guards 11 is the second state, the outer guard 11A, the center guard 11B and the inner guard 11C are positioned at the upper position.

The "third state" (a state shown in FIG. 6A which will be described later) is a state of the plurality of guards when the center guard 11B receives a liquid scattered from a substrate W. When a state of the plurality of guards 11 is the third state, the outer guard 11A and the center guard 11B are positioned at the upper position, and the inner guard 11C is positioned at the lower position.

With reference to FIG. 2 and FIG. 3, the processing unit 2 includes a first chemical liquid nozzle 31 and a second chemical liquid nozzle 32, each of which discharges downward a chemical liquid toward an upper surface of a substrate W, and a first rinse liquid nozzle 33 which discharges a rinse liquid toward the upper surface of the substrate W.

The first chemical liquid nozzle 31 is connected to a first chemical liquid piping 41 which guides the chemical liquid. The second chemical liquid nozzle 32 is connected to a second chemical liquid piping 42 which guides the chemical liquid. The first rinse liquid nozzle 33 is connected to a first rinse liquid piping 43 which guides the rinse liquid. The rinse liquid is a liquid for washing away the chemical liquid.

When a first chemical liquid valve 51 which is interposed in the first chemical liquid piping 41 is opened, the chemical liquid is continuously discharged downward from a discharge port of the first chemical liquid nozzle 31. The first chemical liquid nozzle 31 is an example of a chemical liquid supplying unit which supplies the chemical liquid to an upper surface of a substrate W. When a second chemical liquid valve 52 which is interposed in the second chemical liquid piping 42 is opened, the chemical liquid is continuously discharged downward from a discharge port of the second chemical liquid nozzle 32. The second chemical liquid nozzle 32 is also an example of the chemical liquid supplying unit. When a first rinse liquid valve 53 which is interposed in the first rinse liquid piping 43 is opened, the rinse liquid is continuously discharged downward from a discharge port of the first rinse liquid nozzle 33. The first rinse liquid nozzle 33 is an example of a rinse liquid supplying unit which supplies the rinse liquid to the upper surface of the substrate W.

The chemical liquid discharged from the first chemical liquid nozzle 31 is, for example, DHF (Diluted Hydrofluoric Acid). DHF is a solution prepared by diluting hydrofluoric acid. The chemical liquid discharged from the second chemical liquid nozzle 32 is, for example, SC1 (ammonia-hydrogen peroxide mixture).

The chemical liquid discharged from the first chemical liquid nozzle 31 and the chemical liquid discharged from the second chemical liquid nozzle 32 may be a liquid which contains at least one of sulfuric acid, acetic acid, nitric acid, hydrochloric acid, hydrofluoric acid, buffered hydrofluoric acid (BHF), DHF, ammonia water, hydrogen peroxide water, an organic acid (for example, citric acid, oxalic acid, etc.), an organic alkali (for example, TMAH: tetramethylammonimum hydroxide, etc.), a surfactant and a corrosion inhibitor. As examples of a chemical liquid in which the above chemical liquids are mixed, SPM (sulfuric acid-hydrogen peroxide mixture), SC2 (hydrochloric acid-hydrogen peroxide mixture) can be cited in addition to SC1.

The rinse liquid discharged from the first rinse liquid nozzle 33 is, for example, carbonated water. The rinse liquid may be any one of pure water (deionized water), electrolyzed water, hydrogen water, ozone water, ammonia water and aqueous hydrochloric acid solution of dilute concentration (of, for example, approximately 10 ppm to 100 ppm). The rinse liquid is water or an aqueous solution.

The first chemical liquid nozzle 31, the second chemical liquid nozzle 32 and the first rinse liquid nozzle 33 are each a scanning nozzle capable of moving inside the chamber 4. The processing unit 2 includes a nozzle arm 16 and a nozzle moving unit 18. The nozzle arm 16 holds the first chemical liquid nozzle 31, the second chemical liquid nozzle 32 and the first rinse liquid nozzle 33. The nozzle moving unit 18 allows the nozzle arm 16 to move, thereby allowing the first chemical liquid nozzle 31, the second chemical liquid nozzle 32 and the first rinse liquid nozzle 33 to move at least in the horizontal direction.

The nozzle moving unit 18 allows the first chemical liquid nozzle 31, the second chemical liquid nozzle 32 and the first rinse liquid nozzle 33 to move horizontally between a processing position (a position shown in FIG. 6A which will be described later) and a retracted position (a position shown in FIG. 3). When the first chemical liquid nozzle 31 is positioned at the processing position, the chemical liquid discharged from the first chemical liquid nozzle 31 lands on an upper surface of a substrate W. When the second chemical liquid nozzle 32 is positioned at the processing position, the chemical liquid discharged from the second chemical liquid nozzle 32 lands on the upper surface of the substrate W. When the first rinse liquid nozzle 33 is positioned at the processing position, the rinse liquid discharged from the first rinse liquid nozzle 33 lands on the upper surface of the substrate W. The first chemical liquid nozzle 31, the second chemical liquid nozzle 32 and the first rinse liquid nozzle 33 are positioned around the spin chuck 5 in a plan view, when they are positioned at the retracted position.

The nozzle moving unit 18 is, for example, a turning unit which allows the first chemical liquid nozzle 31, the second chemical liquid nozzle 32 and the first rinse liquid nozzle 33 to move horizontally around a nozzle pivoting axis A2. The nozzle pivoting axis A2 extends vertically around the spin chuck 5 and the processing cup 7.

The processing unit 2 includes a lower surface nozzle 34 which discharges a processing liquid above toward a lower surface central portion of a substrate W. The lower surface nozzle 34 is inserted into a penetrating hole 21a which is opened at an upper surface central portion of the spin base 21. A discharge port 34a of the lower surface nozzle 34 is exposed from the upper surface of the spin base 21. The discharge port of the lower surface nozzle 34 faces a lower surface central portion of the substrate W from below. The lower surface nozzle 34 is connected to a heating fluid piping 44 in which the heating fluid valve 54 is interposed.

When the heating fluid valve 54 is opened, a heating fluid such as warm water is supplied from the heating fluid piping 44 to the lower surface nozzle 34 and continuously discharged upward from the discharge port 34a of the lower surface nozzle 34. The lower surface nozzle 34 is an example of a heating fluid supplying unit which supplies a heating fluid to the lower surface of the substrate W. Warm water is water higher in temperature than a room temperature and, for example, water with temperatures of 80° C. to 85° C. The lower surface nozzle 34 is fixed to the partition wall 24 of the chamber 4. Even if the spin chuck 5 rotates the substrate W, the lower surface nozzle 34 will not rotate.

The heating fluid discharged from the lower surface nozzle 34 is not limited to warm water. The heating fluid discharged from the lower surface nozzle 34 suffices to be a fluid capable of heating a substrate W. The heating fluid discharged from the lower surface nozzle 34 may be, for example, high-temperature nitrogen gas. The heating fluid discharged from the lower surface nozzle 34 may be water vapor. If the heating fluid is water vapor, the substrate W can be heated by a fluid higher in temperature than warm water.

The processing unit 2 includes a central nozzle 60 which discharges downward a processing liquid via a central opening 6b which is opened at a central portion of the facing surface 6a of the facing member 6. The central nozzle 60 is disposed inside a penetrating hole which penetrates through a central portion of the facing member 6 in the up/down direction. A discharge port 60a of the central nozzle 60 is exposed from the central opening 6b and faces the center of the upper surface of the substrate W held by the spin chuck 5. The central nozzle 60 is raised and lowered in the vertical direction together with the facing member 6.

The central nozzle 60 includes a plurality of inner tubes (a first tube 35, a second tube 36, a third tube 37) which discharge a processing liquid downward and a tubular casing 61 which surround the plurality of inner tubes. The first tube 35, the second tube 36, the third tube 37 and the casing 61 extend in the up/down direction along the rotation axis A1. An inner circumferential surface of the facing member 6 surrounds an outer circumferential surface of the casing 61 at intervals in a radial direction (a direction orthogonal to the rotation axis A1). The discharge port 60a of the central nozzle 60 is also a discharge port of the first tube 35, the second tube 36 and the third tube 37.

The first tube 35 discharges a rinse liquid downward toward an upper surface of a substrate W. The first tube 35 is connected to a second rinse liquid piping 45 in which a second rinse liquid valve 55 is interposed. When the second rinse liquid valve 55 is opened, the rinse liquid is supplied from the second rinse liquid piping 45 to the first tube 35 and continuously discharged downward from a discharge port of the first tube 35 (the discharge port 60a of the central nozzle 60). The first tube 35 is an example of a rinse liquid supplying unit which supplies the rinse liquid to the upper surface of the substrate W. The rinse liquid discharged from the first tube 35 is, for example, carbonated water. The rinse liquid discharged from the first tube 35 is not limited to carbonated water. The rinse liquid discharged from the first tube 35 may be, for example, a rinse liquid such as DIW described previously.

Figure 14:
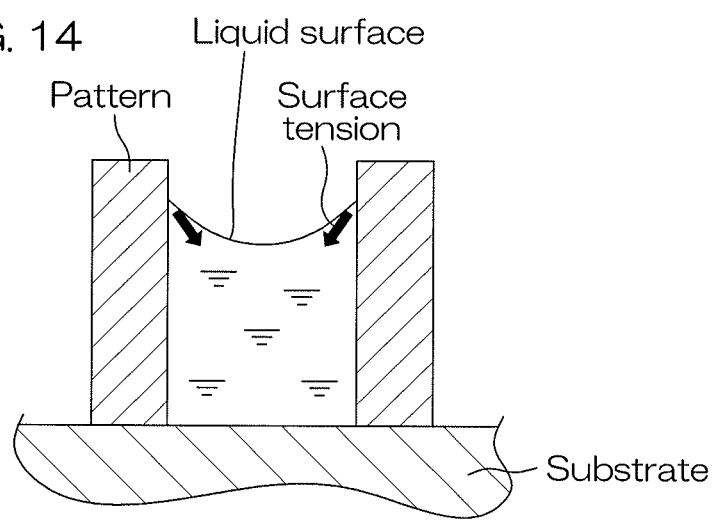
FIG. 14 is an illustrative sectional view for describing a principle of pattern collapse by a surface tension.

The second tube 36 discharges a hydrophobic agent downward toward an upper surface of a substrate W. The hydrophobic agent is a liquid for hydrophobizing the upper surface of the substrate W. A surface tension acting on a pattern (refer to FIG. 14) on the upper surface of the substrate W which is hydrophobized by the hydrophobic agent is lower than a surface tension acting on a pattern on the upper surface of the substrate W which is not hydrophobized. The second tube 36 is connected to a hydrophobic agent piping 46 in which a hydrophobic agent valve 56 is interposed. When the hydrophobic agent valve 56 is opened, the rinse liquid is supplied from the hydrophobic agent piping 46 to the second tube 36 and continuously discharged downward from a discharge port of the second tube 36 (the discharge port 60a of the central nozzle 60). The second tube 36 is an example of a hydrophobic agent supplying unit which supplies the hydrophobic agent to the upper surface of the substrate W.

The hydrophobic agent discharged from the second tube 36 is, for example, a silicon-based hydrophobic agent which hydrophobizes silicon itself and a silicon-containing compound, or a metal-based hydrophobic agent which hydrophobizes a metal itself and a metal-containing compound. The metal-based hydrophobic agent includes at least one of amine with a hydrophobic group and an organic silicon compound. The silicon-based hydrophobic agent is, for example, a silane coupling agent.

The silane coupling agent includes at least any one of, for example, HMDS (hexamethyldisilazane), TMS (tetramethylsilane), fluorinated alkylchlorosilane, alkyldisilazane and a non-chloro hydrophobic agent. The non-chloro hydrophobic agent includes at least one of, for example, dimethylsilyldimethylamine, dimethylsilyldiethylamine, hexamethyldisilazane, tetramethyldisilazane, bis (dimethylamino) dimethylsilane, N, N-dimethylaminotrimethylsilane, N-(trimethylsilyl) dimethylamine and an organosilane compound.

The third tube 37 discharges downward toward an upper surface of a substrate W an organic solvent which is miscible with both a hydrophobic agent and a rinse liquid and also lower in surface tension than water. The liquid lower in surface tension than water is referred to as a low surface-tension liquid. The organic solvent discharged from the third tube 37 is, for example, isopropyl alcohol (IPA). The third tube 37 is connected to an organic solvent piping 47 in which an organic solvent valve 57 is interposed. When the organic solvent valve 57 is opened, IPA is supplied from the organic solvent piping 47 to the third tube 37 and continuously discharged downward from a discharge port of the third tube 37 (the discharge port 60a of the central nozzle 60). The third tube 37 is an example of an organic solvent supplying unit (low surface-tension liquid supplying unit) which supplies an organic solvent (low surface-tension liquid) to the upper surface of the substrate W.

The organic solvent discharged from the third tube 37 may be an organic solvent other than IPA, as long as it is miscible with both a hydrophobic agent and a rinse liquid and also lower in surface tension than water. More specifically, the organic solvent discharged from the third tube 37 may be an organic solvent of a liquid which contains at least one of IPA, HFE (hydrofluroether), methanol, ethanol, acetone, and Trans-1, 2-dichloroehtylene.

The processing unit 2 includes a gas piping 49 which guides a gas from a gas supplying source to the central opening 6b of the facing member 6 and a gas valve 59 which is interposed in the gas piping 49. When the gas valve 59 is opened, the gas supplied from the gas piping 49 flows downward in a tubular gas flow passage 62 which is formed by an outer circumferential surface of the casing 61 of the central nozzle 60 and an inner circumferential surface of the facing member 6 and is discharged downward from the central opening 6b. The gas discharged from the central opening 6b is supplied to a space 90 between the facing surface 6a and an upper surface of a substrate W. The central opening 6b is included in a gas supplying unit which supplies the gas into the space 90. The opening degree of the gas valve 59 can be adjusted, thereby adjusting a flow rate (supply flow rate) of a gas discharged from the central opening 6b. The gas supplied to the central opening 6b is, for example, nitrogen gas. The gas supplied to the central opening 6b is lower in humidity than clean air supplied to an internal space of the chamber 4. Humidity of the clean air is, for example, from 47% to 50%. Humidity of the gas supplied to the central opening 6b is, for example, about 0%.

The gas supplied to the central opening 6b is preferably an inert gas. The inert gas is a gas which is inactive on an upper surface of a substrate Wand in a pattern and may be a rare gas such as argon. The gas discharged from the central opening 6b may be air.

The processing unit 2 includes an internal nozzle 38 which discharges a processing liquid (for example, a hydrophobic agent) toward an upper surface of a substrate W. The internal nozzle 38 includes a horizontal portion 38h which is disposed lower than the upper end 11a of the outer guard 11A and a vertical portion 38v which is disposed above the outer guard 11A. When the outer guard 11A and the center guard 11B are positioned at any position, the horizontal portion 38h is disposed between the outer guard 11A and the center guard 11B. As shown in FIG. 3, the horizontal portion 38h has a circular arc shape in a plan view. The horizontal portion 38h may have a linear shape in a plan view or may have a polygonal line shape in a plan view.

As shown in FIG. 2, the internal nozzle 38 is inserted into a penetrating hole which penetrates through the extension portion 15 of the outer guard 11A in the up/down direction. The vertical portion 38v is disposed above the penetrating hole of the outer guard 11A. The vertical portion 38v penetrates in the up/down direction through a housing 70 disposed above the outer guard 11A. The housing 70 is supported by the outer guard 11A. The vertical portion 38v is rotatably supported by the housing 70. The internal nozzle 38 is able to pivot in relation to the outer guard 11A around a nozzle pivoting axis A3 which corresponds to a center line of the vertical portion 38v. The nozzle pivoting axis A3 is a vertical axis line which passes through the outer guard 11A.

A discharge port 38p which discharges a processing liquid downward is disposed at a leading end portion of the horizontal portion 38h (an end opposite to the nozzle pivoting axis A3). The internal nozzle 38 is connected to a second hydrophobic agent piping 48 in which a second hydrophobic agent valve 58 is interposed. When the second hydrophobic agent valve 58 is opened, a hydrophobic agent is supplied from the second hydrophobic agent piping 48 to the internal nozzle 38 and continuously discharged downward from the discharge port 38p of the internal nozzle 38.

The processing unit 2 includes a scanning unit 71 which pivots the internal nozzle 38 between the processing position and the retracted position around the nozzle pivoting axis A3. When the internal nozzle 38 is positioned at the processing position, the processing liquid discharged from the internal nozzle 38 lands on an upper surface of a substrate W. When positioned at the retracted position, the internal nozzle 38 is positioned around the spin chuck 5 in a plan view.

The scanning unit 71 includes an electric motor 72 which generates power for pivoting the internal nozzle 38. The electric motor 72 may be a coaxial motor which is coaxial to the vertical portion 38v of the internal nozzle 38 or may be coupled to the vertical portion 38v of the internal nozzle 38 via an endless belt.

When the internal nozzle 38 is positioned at the retracted position (a position shown by a dotted line in FIG. 3), the horizontal portion 38h of the internal nozzle 38 entirely overlaps the outer guard 11A. When the internal nozzle 38 is positioned at the processing position (a position shown by a double dotted & dashed line in FIG. 3), the leading end portion of the horizontal portion 38h is disposed further inside than the upper end 11a of the outer guard 11A, and the internal nozzle 38 overlaps a substrate W. The processing position includes a central processing position (a position shown by a double dotted & dashed line in FIG. 3) at which the processing liquid discharged from the internal nozzle 38 lands on an upper surface central portion of the substrate W and an outer circumferential processing position at which the processing liquid discharged from the internal nozzle 38 lands on an outer circumference portion of the upper surface of the substrate W.

The extension portion 15 of the outer guard 11A includes an annular inclined portion 15a extending obliquely from an upper end of the tubular portion 14 of the outer guard 11A toward the rotation axis A1 and a protrusion portion 15b protruding upward from the inclined portion 15a. The inclined portion 15a and the protrusion portion 15b are disposed side by side in a circumferential direction (a direction around the rotation axis A1). The protrusion portion 15b includes a pair of side walls 15s extending upward from the inclined portion 15a, an upper wall 15u disposed between upper ends of the pair of side walls 15s, and an outer wall 15o disposed between outer ends of the pair of side walls 15s. The protrusion portion 15b forms a housing space which is recessed above from a lower surface of the inclined portion 15a of the outer guard 11A.

When the internal nozzle 38 is positioned at the retracted position, the horizontal portion 38h of the internal nozzle 38 entirely overlaps the protrusion portion 15b in a plan view and is housed at the housing space. As shown in FIG. 2, at this time, the leading end portion of the horizontal portion 38h at which the discharge port 38p is provided is disposed further outside than the upper end 11a of the outer guard 11A. When the internal nozzle 38 is positioned at the retracted position, the upper end 11a of the outer guard 11A and the upper end 11a of the center guard 11B can be brought closer to each other in the up/down direction. It is, thereby, possible to reduce the amount of a liquid which enters between the outer guard 11A and the center guard 11B.

As described previously, the internal nozzle 38 is supported by the housing 70. Likewise, the scanning unit 71 is also supported by the housing 70. The electric motor 72 of the scanning unit 71 is disposed inside bellows 73 which is extendable in the up/down direction. The housing 70 is supported by the outer guard 11A via a first bracket 74A and supported by the guard raising/lowering unit 17 via a second bracket 74B. When the guard raising/lowering unit 17 raises and lowers the outer guard 11A, the housing 70 is also raised and lowered. Thereby, the internal nozzle 38 and the scanning unit 71 are also raised and lowered, together with the outer guard 11A.

Figure 4:
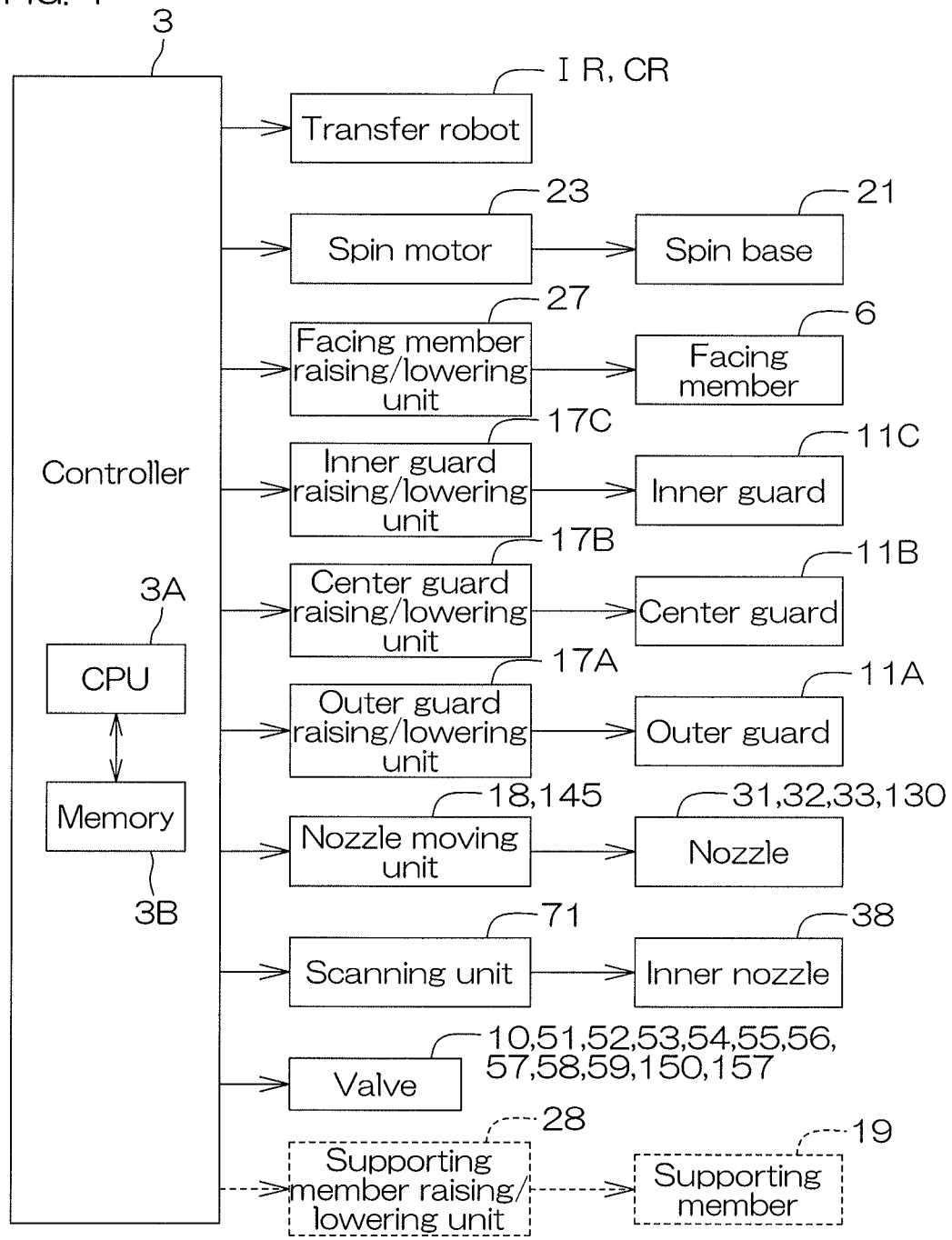
FIG. 4 is a block diagram for describing an electrical configuration of a main portion of the substrate processing apparatus.

FIG. 4 is a block diagram for describing an electrical configuration of main portions of the substrate processing apparatus 1. The controller 3 is provided with a microcomputer to control targets to be controlled which are provided in the substrate processing apparatus 1 according to predetermined programs. More specifically, the controller 3 includes a processor (CPU) 3A and a memory 3B in which programs are installed and is configured so as to execute various types of control for substrate processing according to programs executed by the processor 3A.

The controller 3 controls, in particular, motions of the transfer robots IR, CR, the spin motor 23, the facing member raising/lowering unit 27, the guard raising/lowering unit 17 (outer guard raising/lowering unit 17A, center guard raising/lowering unit 17B, inner guard raising/lowering unit 17C), the nozzle moving unit 18, valves 10, 51 to 59, etc. The valves 51 to 58 are controlled, thereby controlling a fluid discharged from corresponding nozzles (tubes) and a discharge flow rate thereof. The valve 59 is controlled, thereby controlling a gas discharged from the central opening 6b and a discharge flow rate thereof. The valve 10 is controlled, thereby controlling an evacuated gas from the evacuating duct 9 and an evacuation flow rate thereof.

Figure 5:
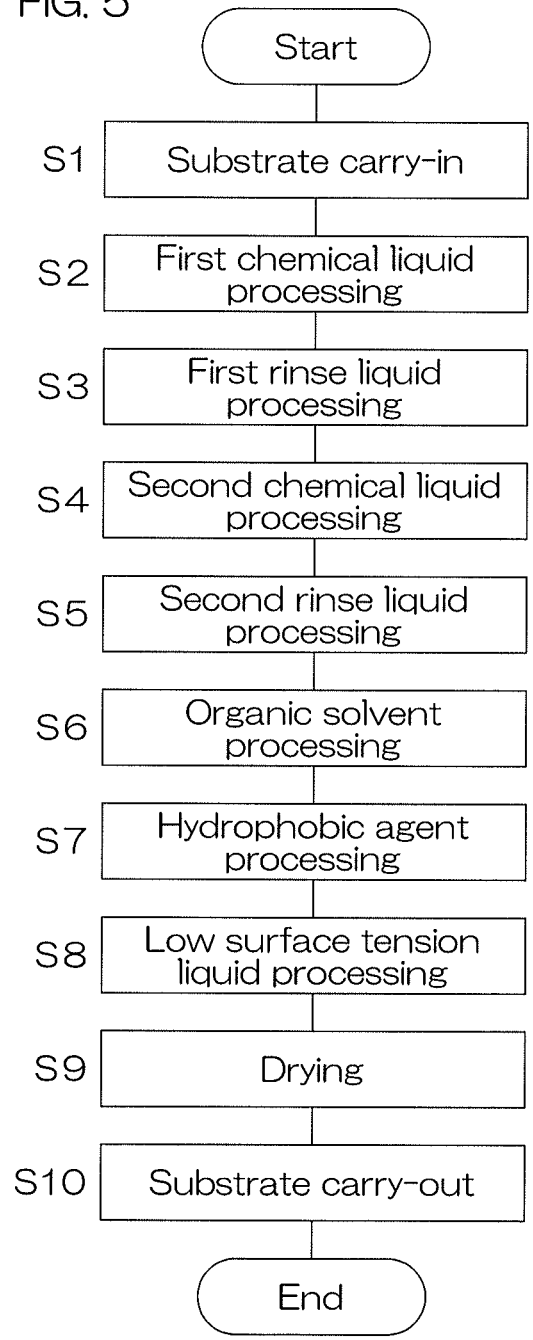
FIG. 5 is a flowchart for describing one example of substrate processing by the substrate processing apparatus.

FIG. 5 is a flowchart for describing an example of substrate processing by the substrate processing apparatus 1, mainly showing the processing performed according to programs executed by the controller 3. FIG. 6A to FIG. 6K are each an illustrative sectional view for describing an example of the substrate processing. FIG. 7 is a timechart for describing an example of the substrate processing.

In the substrate processing by the substrate processing apparatus 1, for example, as shown in FIG. 5, the following are executed in order given below, namely, substrate carry-in (S1), first chemical liquid processing (S2), first rinse liquid processing (S3), second chemical liquid processing (S4), second rinse liquid processing (S5), organic solvent processing (S6), hydrophobic agent processing (S7), low surface-tension liquid processing (S8), drying processing (S9) and substrate carry-out (S10).

First, with reference to FIG. 1, in the substrate processing by the substrate processing apparatus 1, a substrate W is carried in the processing unit 2 from the carrier C by the transfer robots IR, CR and delivered to the spin chuck 5 (Step S1: substrate carry-in). In the substrate processing by the substrate processing apparatus 1, the evacuating valve 10 (refer to FIG. 2) is constantly opened and the opening degree of the evacuating valve 10 is kept constant.

Figure 6A:
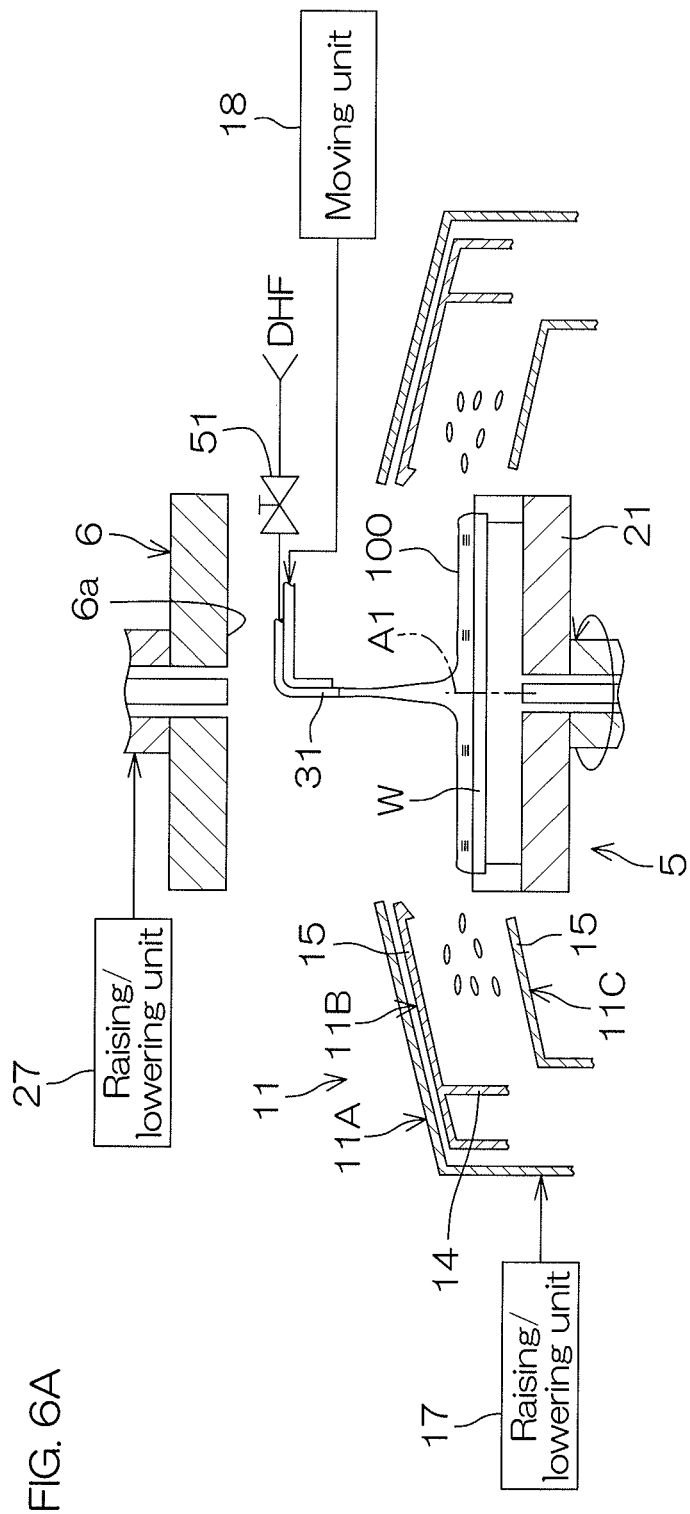
Figure 7:
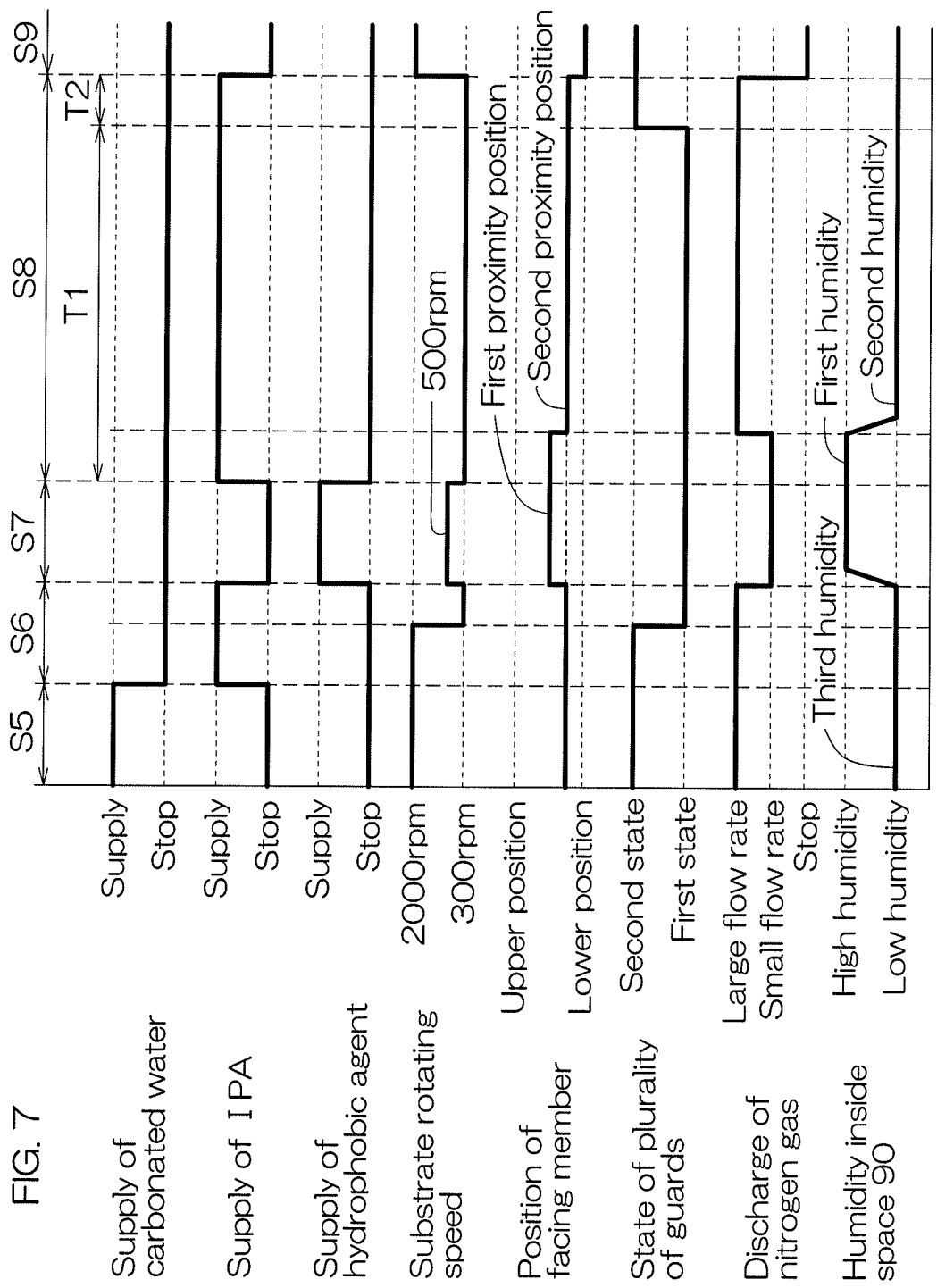
FIG. 7 is a timechart for describing one example of the substrate processing.

Then, with reference to FIG. 6A, until being carried out by the transfer robot CR, the substrate W is held horizontally by the spin chuck 5 at a position surrounded by the plurality of guards 11 (substrate holding step). Then, the spin motor 23 (refer to FIG. 2) starts to rotate the spin base 21. Thereby, rotation of the substrate W is started (substrate rotating step). Then, the facing member raising/lowering unit 27 positions the facing member 6 at the upper position.

Then, the first chemical liquid processing (S2) is started. In the first chemical liquid processing (S2), DHF (Diluted Hydrofluoric Acid) is supplied as a chemical liquid to the substrate W.

Specifically, the guard raising/lowering unit 17 switches a state of the plurality of guards 11 to the third state. Then, the nozzle moving unit 18 moves the first chemical liquid nozzle 31, the second chemical liquid nozzle 32 and the first rinse liquid nozzle 33 to the processing position. Then, the first chemical liquid valve 51 is opened. Thereby, DHF (chemical liquid) is supplied from the first chemical liquid nozzle 31 to a central region of the upper surface of the substrate W in a rotating state (chemical liquid supplying step). DHF spreads across an entirety of the upper surface of the substrate W due to a centrifugal force. Thereby, a liquid film 100 of DHF is formed on the substrate W. DHF is scattered from the substrate W in the radially outer side due to a centrifugal force. The liquid scattered from the substrate W passes between the extension portion 15 of the center guard 11B and the extension portion 15 of the inner guard 11C and is received by the tubular portion 14 of the center guard 11B.

Next, the first rinse liquid processing (S3) is executed. In the first rinse liquid processing (S3), DHF on the substrate W is washed away by DIW.

Figure 6B:
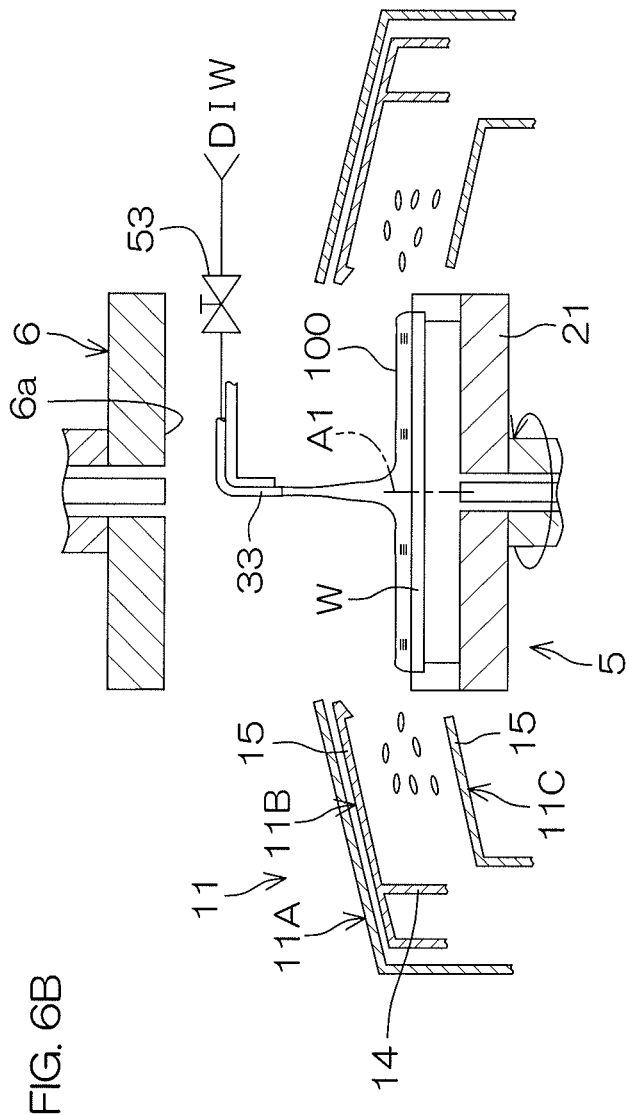

Specifically, the first chemical liquid valve 51 is closed. Thereby, discharge of DHF from the first chemical liquid nozzle 31 is stopped. Then, as shown in FIG. 6B, the first rinse liquid valve 53 is opened. Thereby, DIW (rinse liquid) is supplied from the first rinse liquid nozzle 33 toward a central region of the upper surface of the substrate W in the rotating state (rinse liquid supplying step). DIW spreads across the entirety of the upper surface of the substrate W due to a centrifugal force. Thereby, DHF inside the liquid film 100 on the substrate W is replaced by DIW. A mixture solution of DHF with DIW and DIW are scattered to the radially outer side from the substrate W due to a centrifugal force. The liquid scattered from the substrate W passes between the extension portion 15 of the center guard 111B and the extension portion 15 of the inner guard 11C and is received by the tubular portion 14 of the center guard 11B.

Next, the second chemical liquid processing (S4) is executed. In the second chemical liquid processing (S4), SC1 is supplied to the upper surface of the substrate W.

Figure 6C:
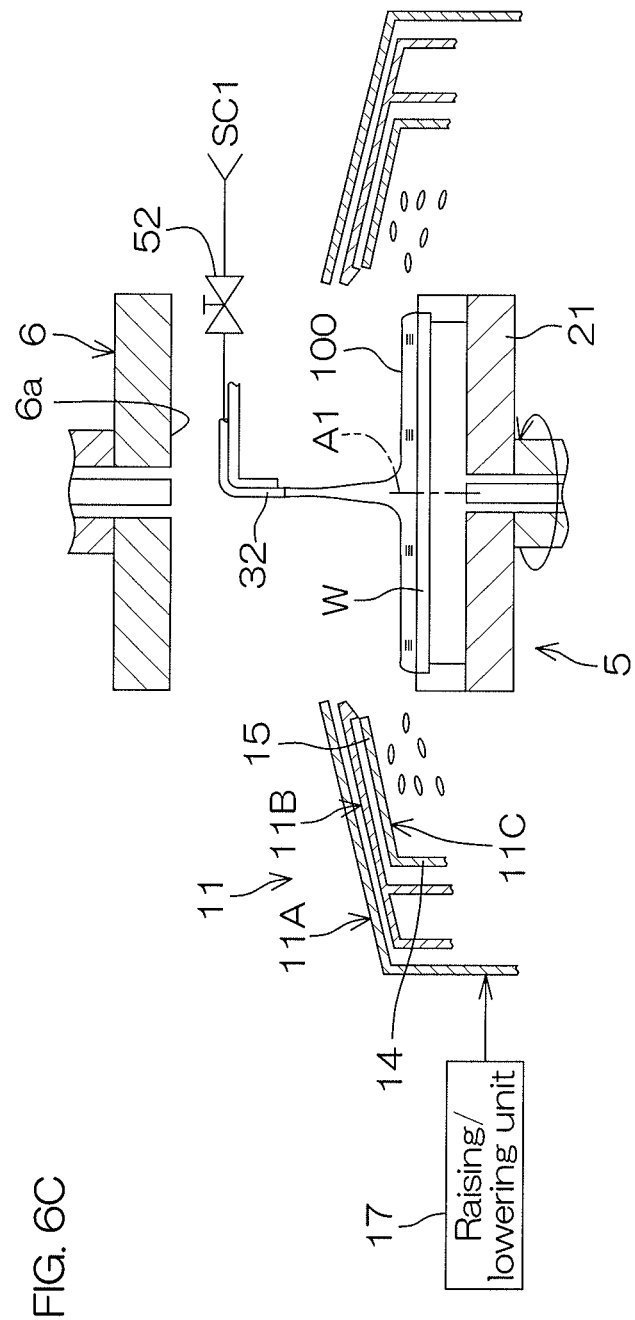
Figure 6D:
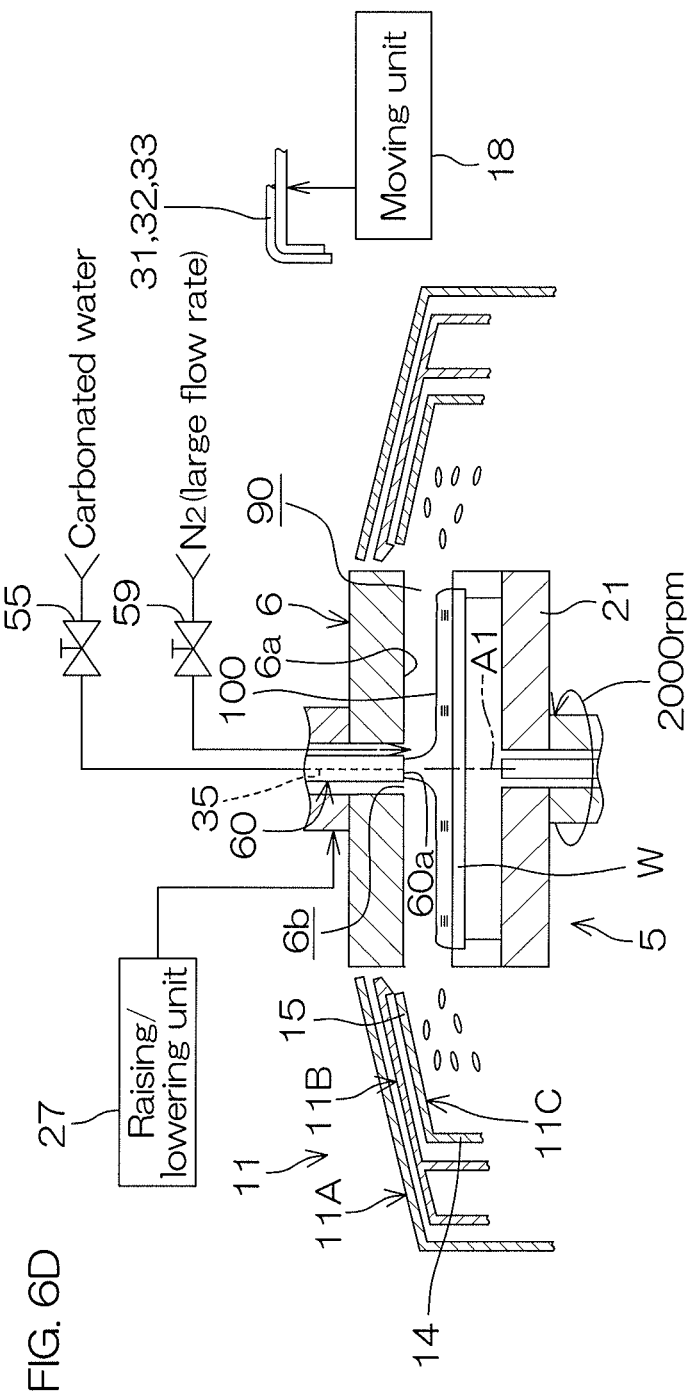

Specifically, the first rinse liquid valve 53 is closed. Thereby, discharge of DIW from the first rinse liquid nozzle 33 is stopped. Then, as shown in FIG. 6C, the guard raising/lowering unit 17 switches a state of the plurality of guards 11 from the third state to the second state. Specifically, the plurality of guards 11 are made into a state in which the liquid scattered from substrate W is received by the inner guard 11C.

Then, the second chemical liquid valve 52 is opened. Thereby, SC1 is discharged (supplied) from the second chemical liquid nozzle 32 toward a central region of the upper surface of the substrate W in the rotating state (chemical liquid supplying step). The chemical liquid spreads across the entirety of the upper surface of the substrate W due to a centrifugal force. Thereby, DIW inside the liquid film 100 on the substrate W is replaced by SC1. Then, the upper surface of the substrate W is processed by SC1. A mixture solution of SC1 with DIW and SC1 are scattered from the substrate W to the radially outer side due to a centrifugal force. The liquid scattered from the substrate W passes below the extension portion 15 of the inner guard 11C and is received by the tubular portion 14 of the inner guard 11C.

Next, the second rinse liquid processing (S5) is executed. In the second rinse liquid processing (S5), SC1 on the substrate W is washed away by carbonated water. Specifically, with reference to FIG. 6D and FIG. 7, the second chemical liquid valve 52 is closed. Thereby, discharge of SC1 from the second chemical liquid nozzle 32 is stopped. Then, the nozzle moving unit 18 positions the first chemical liquid nozzle 31, the second chemical liquid nozzle 32 and the first rinse liquid nozzle 33 at the retracted position.

Then, the facing member raising/lowering unit 27 positions the facing member 6 at a proximity position between the upper position and the lower position. In this substrate processing, the proximity distance includes a first proximity position (a position shown in FIG. 6G which will be described later) and a second proximity position (a position shown in FIG. 6D) which is separated further from the upper surface of the substrate W than the first proximity position. A distance between the lower surface of the facing member 6 positioned at the first proximity position and the upper surface of the substrate W is referred to as a first distance. The first distance is, for example, 15 mm. A distance between the lower surface of the facing member 6 positioned at the second proximity position and the upper surface of the substrate W is referred to as a second distance. The second distance is, for example, 5 mm. In the second rinse liquid processing, the facing member 6 is positioned at the second proximity position.

Here, if the upper end 11a of at least one of the guards 11 is positioned at a height position equal to the facing surface 6a of the facing member 6 or higher than the facing surface 6a of the facing member 6, it is possible to enhance the degree of sealing of the space 90 between the upper surface of the substrate W and the facing surface 6a of the facing member 6. In a state that the plurality of guards 11 are positioned at the upper position and the facing member 6 is also positioned at the first proximity position, the upper ends 11a of the plurality of guards 11 are positioned higher than the facing surface 6a. Therefore, the space 90 is enhanced in degree of sealing (sealing step).

In a state that the space 90 is enhanced in degree of sealing, the gas valve 59 is opened. Thereby, the nitrogen gas discharged from the central opening 6b of the facing member 6 starts to be supplied to an interior of the space 90 (gas supplying step, inert gas supplying step). Further, the evacuating valve 10 (refer to FIG. 2) is kept opened. Therefore, the atmosphere (atmosphere in the vicinity of the upper surface of the substrate W) in the space 90 is evacuated (evacuating step). Therefore, replacement of air inside the space 90 is started, thereby starting adjustment of humidity of the atmosphere inside the space 90. Specifically, the humidity inside the space 90 starts to change so as to be close to the humidity of nitrogen gas discharged from the central opening 6b of the facing member 6. In the second rinse liquid processing, a flow rate (discharge flow rate) of nitrogen gas discharged from the central opening 6b of the facing member 6 is a relatively large flow rate. In the second rinse liquid processing, a discharge flow rate of nitrogen gas is, for example, 50 L/min.

Then, the second rinse liquid valve 55 is opened. Thereby, carbonated water (rinse liquid) is discharged (supplied) from the discharge port 60a of the first tube 35 of the central nozzle 60 toward a central region of the upper surface of the substrate W in the rotating state (rinse liquid supplying step). A flow rate (discharge flow rate) of carbonated water discharged from the first tube 35 is, for example, 2000 mL/min. The carbonated water spreads across the entirety of the upper surface of the substrate W due to a centrifugal force. Thereby, SC1 inside a liquid film 100 on the substrate W is replaced by the carbonated water.

A mixture of SC1 with carbonated water and carbonated water are scattered from the substrate W to the radially outer side due to a centrifugal force. A state of the plurality of guards 11 is kept at the same second state as the second chemical liquid processing (S4). Therefore, the liquid scattered from the substrate W passes further below than the extension portion 15 of the inner guard 11C and is received by the tubular portion 14 of the center guard 11B. In the second rinse liquid processing, the spin motor 23 rotates the substrate W at 2000 rpm.

After the elapse of a predetermined time (for example, 15 seconds) from start of supply of carbonated water to the upper surface of the substrate W, the organic solvent processing (S6) is executed. In the organic solvent processing (S6), carbonated water (rinse liquid) on the upper surface of the substrate W is replaced by IPA (organic solvent).

Figure 6E:
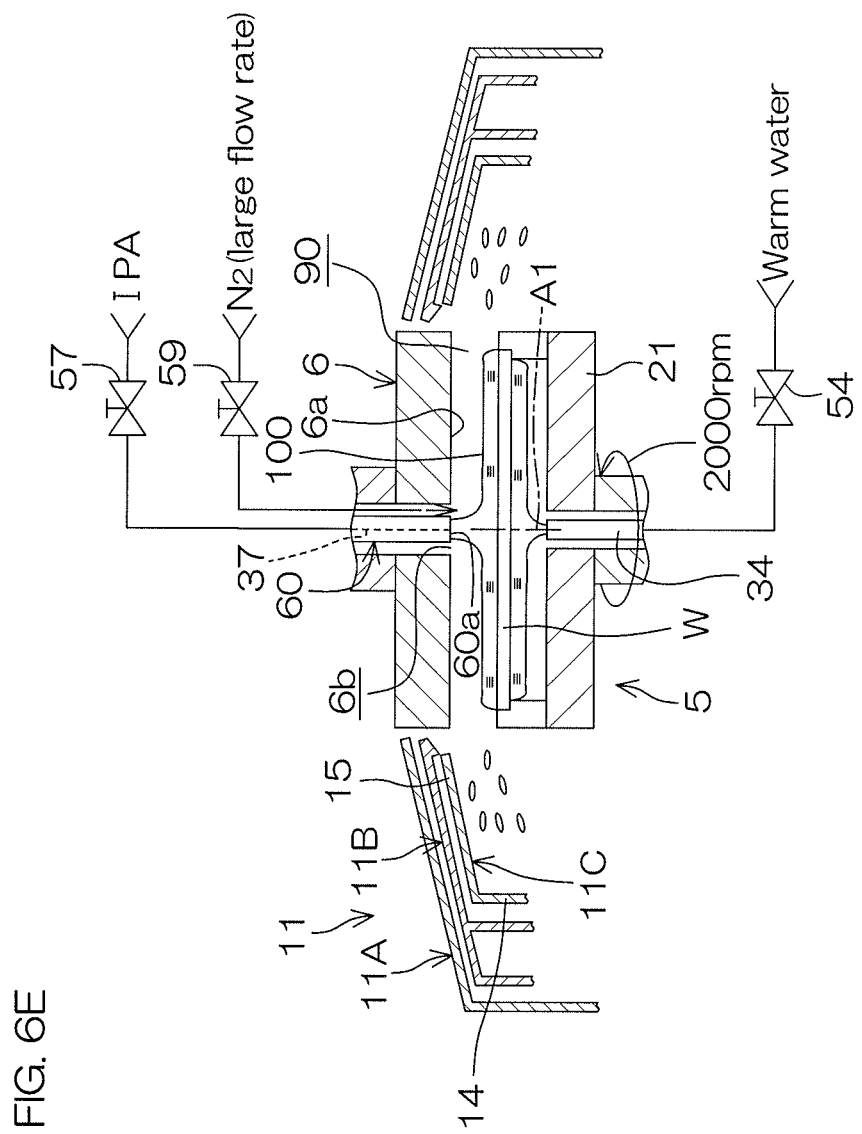

Specifically, with reference to FIG. 6E and FIG. 7, the second rinse liquid valve 55 is closed. Thereby, discharge of carbonated water from the first tube 35 is stopped. Then, the organic solvent valve 57 is opened. Thereby, IPA (organic solvent) is discharged (supplied) from the discharge port 60*a* of the third tube 37 of the central nozzle 60 toward a central region of the upper surface of the substrate W in the rotating state (organic solvent supplying step). A flow rate (discharge flow rate) of IPA discharged from the third tube 37 is, for example, 300 mL/min. IPA spreads across the entirety of the upper surface of the substrate W due to a centrifugal force. Since IPA is miscible with carbonated water, carbonated water inside the liquid film 100 on the substrate W is replaced by IPA. A mixture of carbonated water with IPA and IPA are scattered from the substrate W to the radially outer side due to a centrifugal force.

A state of the plurality of guards 11 is kept at the same second state as with the second rinse liquid processing (S5). Therefore, the liquid scattered from the substrate W is received by the tubular portion 14 of the inner guard 11C. A position of the facing member 6 is kept at the same first proximity position as with the second rinse liquid processing (S5).

Then, a heating fluid valve 54 is opened. Thereby, warm water (heating fluid) is discharged from the lower surface nozzle 34 toward a central region of the lower surface of the substrate W. Thereby, a heating fluid supplying step is started and heating of the substrate W is started (substrate heating step). Thus, the lower surface nozzle 34 functions as a substrate heating unit for heating the substrate W. The heating fluid supplying step is executed in parallel with the organic solvent supplying step. The rotating speed of the substrate W is kept at the same speed (2000 rpm) as with the second rinse liquid processing (S5). The discharge flow rate of nitrogen gas discharged from the central opening 6*b* of the facing member 6 is also kept at the large flow rate.

Figure 6F:
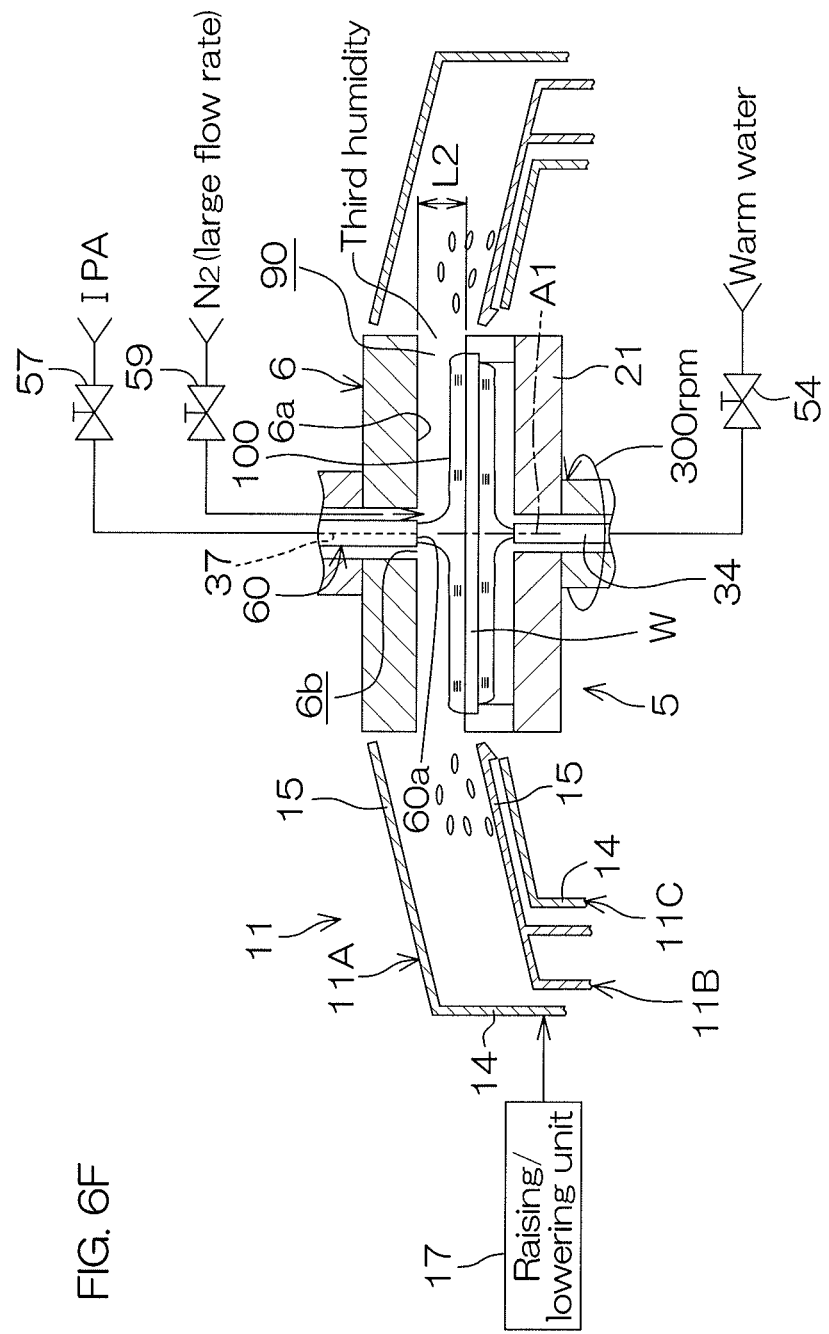

After the elapse of a predetermined time (for example, 9 seconds) from start of discharge of IPA from the third tube 37, as shown in FIG. 6F, the guard raising/lowering unit 17 switches a state of the plurality of guards 11 from a second state to a first state (first guard switching step). During execution of the first guard switching step, at least the upper end 11*a* of the outer guard 11A is positioned higher than the facing surface 6*a*. That is, even during execution of the first guard switching step, the sealing step is being executed. Further, a rotating speed of the substrate W is changed from 2000 rpm to 300 rpm.

After the elapse of a predetermined time (for example, 6 seconds) from a change in position of the plurality of guards 11, the hydrophobic agent processing (S7) is started. In the hydrophobic agent processing (S7), the upper surface of the substrate W is hydrophobized by a hydrophobic agent.

Figure 6G:
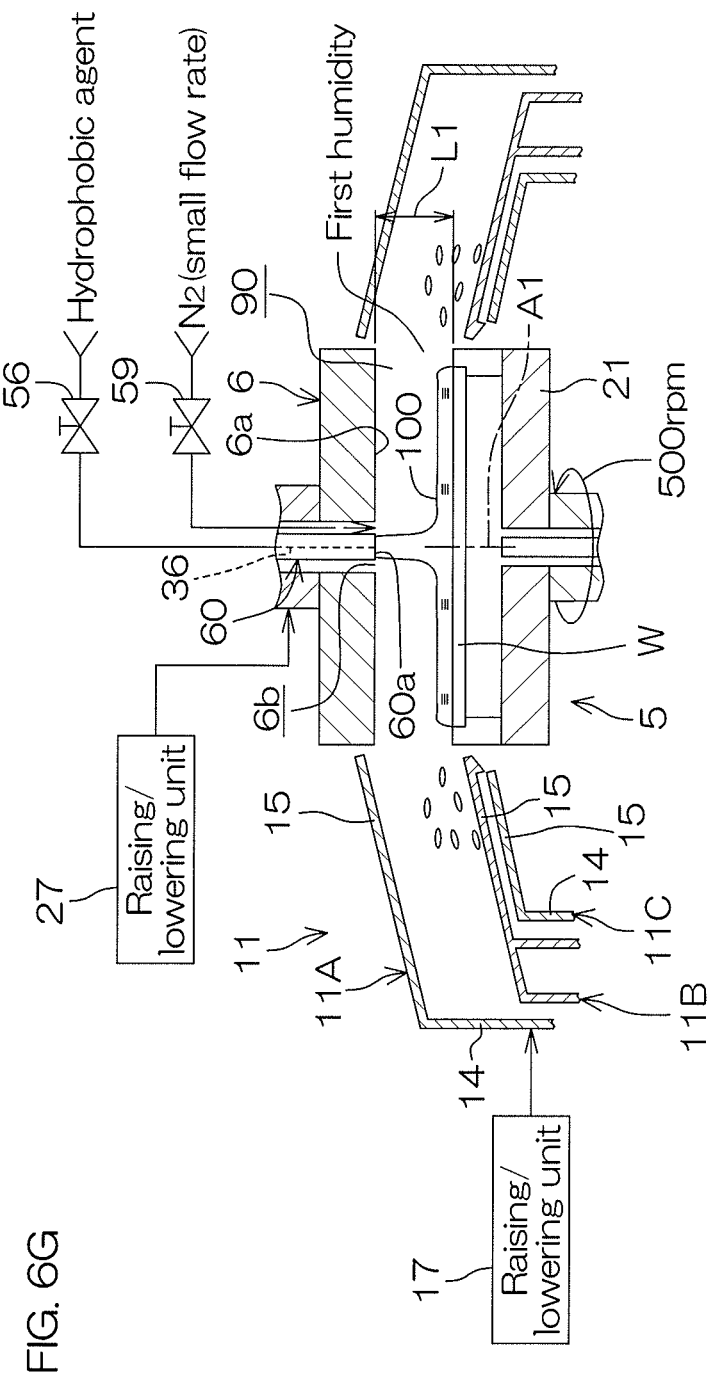

Specifically, with reference to FIG. 6G and FIG. 7, the organic solvent valve 57 is closed. Thereby, discharge of an organic solvent from the third tube 37 is stopped. Then, the hydrophobic agent valve 56 is opened. Thereby, a hydrophobic agent is discharged (supplied) from the discharge port 60*a* of the second tube 36 of the central nozzle 60 toward a central region of the upper surface of the substrate W in the rotating state (hydrophobic agent supplying step). A flow rate (discharge flow rate) of the hydrophobic agent discharged from the second tube 36 is, for example, 150 mL/min. The hydrophobic agent spreads across the entirety of the upper surface of the substrate W due to a centrifugal force. Since IPA is miscible with the hydrophobic agent, IPA inside the liquid film 100 on the substrate W is replaced by the hydrophobic agent. A mixture of IPA with the hydrophobic agent and the hydrophobic agent are scattered from the substrate W to the radially outer side due to a centrifugal force.

A state of the plurality of guards 11 is kept at the first state. Therefore, the liquid scattered from the substrate W passes between the extension portion 15 (first extension portion) of the outer guard 11A (first guard) and the extension portion 15 (second extension portion) of the inner guard 11C (second guard) and is received by the tubular portion 14 (first tubular portion) of the outer guard 11A. Strictly speaking, the liquid scattered from the substrate W passes between the extension portion 15 of the outer guard 11A and the extension portion 15 of the center guard 11B. The rotating speed of the substrate W is changed from 300 rpm to 500 rpm. Then, the opening degree of the gas valve 59 is adjusted and a discharge flow rate of nitrogen gas is changed to a relatively small flow rate (for example, 10 L/min).

Then, the facing member raising/lowering unit 27 moves the facing member 6 to the first proximity position which is positioned higher than the second proximity position. In a state that the outer guard 11A is positioned at the upper position and the facing member 6 is also positioned at the first proximity position, the upper end 11*a* of the outer guard 11A is positioned higher than the facing surface 6*a*. Therefore, there is kept a state that the space 90 is enhanced in degree of sealing. Further, evacuation of the atmosphere inside the space 90 by the evacuating unit 8 is continued even after the first guard switching step.

The facing member 6 is moved from the second proximity position to the first proximity position at the same time when supply of a hydrophobic agent is started. Timing when the facing member 6 is moved from the second proximity position to the first proximity position may be slightly earlier than the start of supply of the hydrophobic agent or may be slightly later than the start of supply of the hydrophobic agent.

After the elapse of a predetermined time (for example, 15 seconds) from start of discharge of the hydrophobic agent, the low surface-tension liquid processing (S8) is started. In the low surface-tension liquid processing (S8), the hydrophobic agent on the upper surface of the substrate W is replaced by IPA.

Figure 6H:
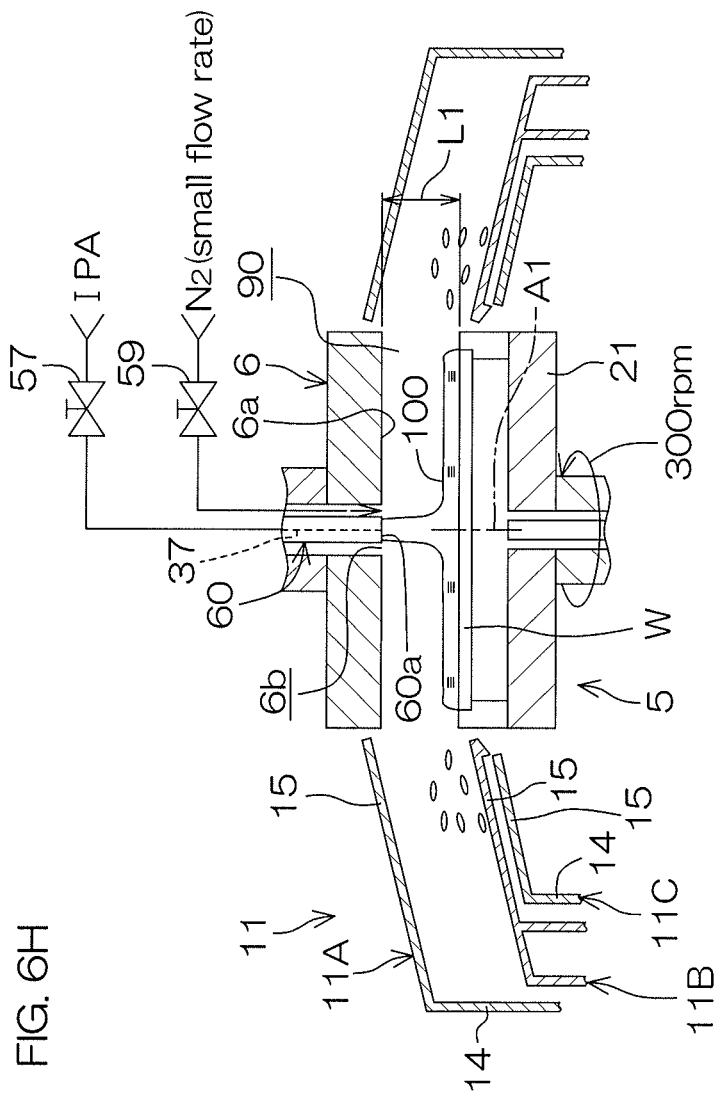

Specifically, with reference to FIG. 6H and FIG. 7, the hydrophobic agent valve 56 is closed. Thereby, discharge of the hydrophobic agent from the second tube 36 is stopped. Then, the organic solvent valve 57 is opened. Thereby, IPA (low surface-tension liquid) is discharged (supplied) from the discharge port 60a of the third tube 37 of the central nozzle 60 toward a central region of the upper surface of the substrate W in the rotating state (low surface-tension liquid supplying step). A discharge flow rate of IPA in the low surface-tension liquid supplying step is the same as that in the organic solvent supplying step and, for example, 300 mL/min. IPA spreads across the entirety of the upper surface of the substrate W due to a centrifugal force. Thereby, the hydrophobic agent inside the liquid film 100 on the substrate W is replaced by IPA.

A mixture of IPA with hydrophobic agent is scattered from the substrate W to the radially outer side due to a centrifugal force. A state of the plurality of guards 11 is kept at the first state. In other words, the first guard switching step is executed before start of the low surface-tension liquid supplying step. Therefore, the liquid scattered from the substrate W is received by the tubular portion 14 of the outer guard 11A.

The rotating speed of the substrate W is changed from 500 rpm to 300 rpm. In the low surface-tension liquid processing (S8), the rotating speed of the substrate W is kept at 300 rpm.

Figure 6I:
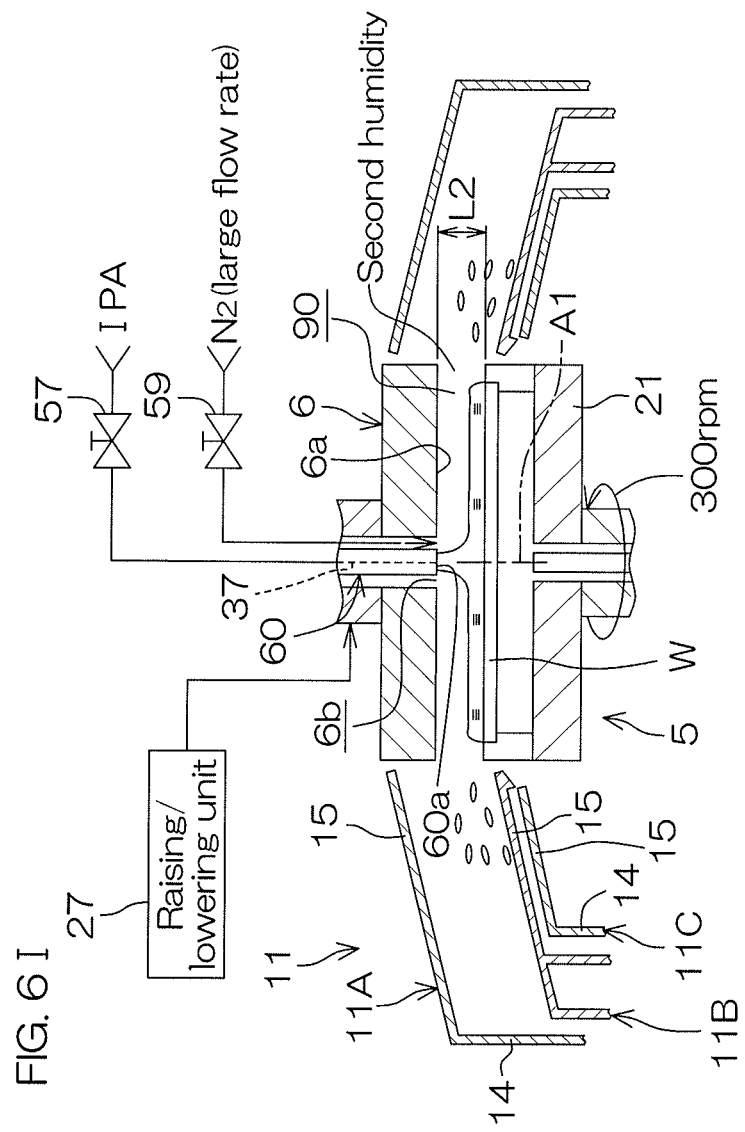

As shown in FIG. 6I, after the elapse of a predetermined time (for example, 10 seconds) from start of discharge of IPA, the facing member raising/lowering unit 27 moves the facing member 6 from the first proximity position to the second proximity position. In other words, during execution of the low surface-tension liquid supplying step, a distance between the facing surface 6a and the upper surface of the substrate W is changed from a first distance L1 to a second distance L2. In a state that the outer guard 11A is positioned at the upper position and also the facing member 6 is positioned at the second proximity position, the upper end 11a of the outer guard 11A is positioned higher than the facing surface 6a. Therefore, there is kept a state that the space 90 is enhanced in degree of sealing. Then, the opening degree of the gas valve 58 is adjusted and a discharge flow rate of nitrogen gas is changed to a relatively large flow rate (for example, 50 L/min).

Figure 6J:
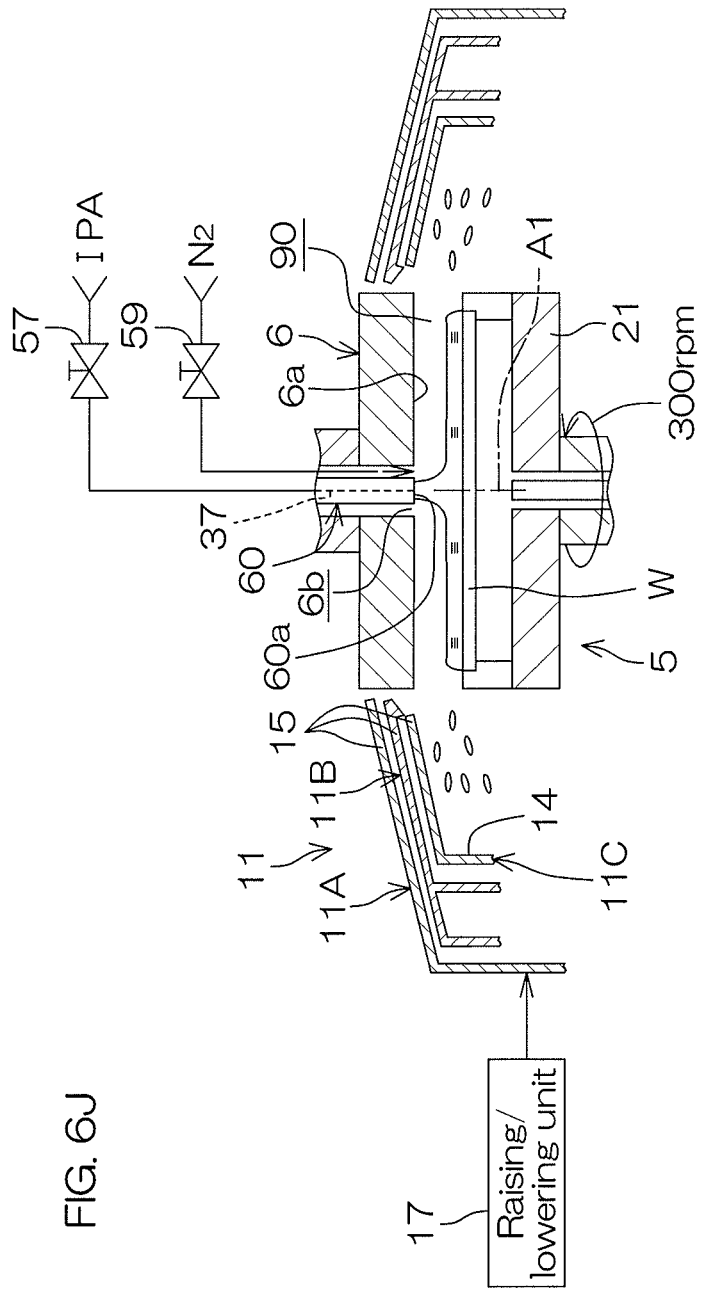

After the elapse of a predetermined time (for example, 40 seconds) from movement of the facing member 6 to the first proximity position, as shown in FIG. 6J, the guard raising/lowering unit 17 switches a state of the plurality of guards 11 from the first state to the second state (second guard switching step). The second guard switching step is executed while IPA is discharged from the third tube 37 (during execution of low surface-tension liquid supplying step). It is preferable that the state of the plurality of guards 11 is switched from the first state to the second state such that time T1 during which the liquid scattered from the substrate W is received by the outer guard 11A in the low surface-tension liquid supplying step is made longer than time T2 during which the liquid scattered from the substrate W is received by the inner guard 11C in the low surface-tension liquid supplying step (refer to FIG. 7). It is more preferable that after complete replacement of the hydrophobic agent on the substrate W by IPA, a state of the plurality of guards 11 is switched from the first state to the second state.

A state of the plurality of guards 11 is switched to the second state by the second guard switching step. Therefore, the liquid scattered from the substrate W passes below the extension portion 15 (second extension portion) of the inner guard 11C (second guard) and is received by the tubular portion 14 (second tubular portion) of the inner guard 11C.

After the elapse of a predetermined time (for example, 10 seconds) from a state of the plurality of guards 11 switched to the second state, the drying processing (S9) is started. In the drying processing, the liquid film 100 of the low surface-tension liquid on the substrate W is removed from the substrate W due to a centrifugal force, thereby drying the substrate W (substrate drying step).

In detail, with reference to FIG. 6K and FIG. 7, the organic solvent valve 57 and the gas valve 58 are closed. Thereby, supply of IPA to the upper surface of the substrate W is stopped and supply of nitrogen gas to the space 90 between the upper surface of the substrate W and the facing surface 6a of the facing member 6 is also stopped. Then, the facing member raising/lowering unit 27 moves the facing member 6 to the lower position. Then, the spin motor 23 rotates the substrate W, for example, at 2000 rpm. Thereby, a liquid composition on the substrate W is removed to dry the substrate W.

Thereafter, the spin motor 23 stops rotation of the spin chuck 5. Then, the facing member raising/lowering unit 27 moves the facing member 6 to the upper position. Then, the guard raising/lowering unit 17 positions the plurality of guards 11 at the lower position. Thereafter, with reference to FIG. 1 as well, the transfer robot CF advances into the processing unit 2, scoops up a substrate W which has been processed from the spin chuck 5 and carries it out from the processing unit 2 (S10). The substrate W is delivered from the transfer robot CR to the transfer robot IR and housed in the carrier C by the transfer robot IR.

Then, a description will be given of a change in humidity inside the space 90 between the facing surface 6a of the facing member 6 and the upper surface of the substrate W.

Here, the smaller the distance between the facing surface 6a of the facing member 6 and the upper surface of the substrate W is, the smaller the volume of the atmosphere to be replaced by a gas such as nitrogen gas will be. Therefore, there is increased a ratio of a gas which is pushed out from the space between the facing surface 6a and the upper surface of the substrate W by nitrogen gas per unit time in the atmosphere between the facing surface 6a and the upper surface of the substrate W. Therefore, the smaller the distance between the facing surface 6a of the facing member 6 and the upper surface of the substrate W is, the more the humidity inside the space 90 between the facing surface 6a of the facing member 6 and the upper surface of the substrate W comes close to the humidity of the gas discharged from the central opening 6b of the facing member 6. That is, the humidity is decreased inside the space 90 between the facing surface 6a of the facing member 6 and the upper surface of the substrate W.

Further, the larger the flow rate of the gas discharged from the central opening 6b of the facing member 6 is, the more the humidity inside the space 90 between the facing surface 6a of the facing member 6 and the upper surface of the substrate W comes close to the humidity of the gas discharged from the central opening 6b of the facing member 6. That is, the humidity is decreased inside the space 90 between the facing surface 6a of the facing member 6 and the upper surface of the substrate W.

With reference to FIG. 7, in the hydrophobic agent processing (S7), the facing member raising/lowering unit 27 positions the facing member 6 at the first proximity position which is further separated from the upper surface of the substrate W than the second proximity position. The gas valve 59 is also adjusted for its opening degree and the discharged nitrogen gas is set to be relatively small in flow rate. Therefore, the humidity inside the space 90 between the facing surface 6a of the facing member 6 and the upper surface of the substrate W is adjusted to be relatively high in humidity (first humidity) (humidity adjusting step). It is not necessary that the humidity of the entire space 90 is set to be the first humidity, so long as at least the humidity of the atmosphere in contact with the liquid film 100 on the substrate W is the first humidity.

In the low surface-tension liquid processing (S8), the facing member raising/lowering unit 27 positions the facing member 6 at the second proximity position. That is, the distance between the facing surface 6a and the upper surface of the substrate W is changed from the first distance L1 to the second distance L2. Further, the gas valve 59 is adjusted for its opening degree and nitrogen gas is changed so as to be relatively large in discharge flow rate. Thereby, the humidity inside the space 90 is adjusted to be the second humidity lower than the first humidity (humidity adjusting step). It is not necessary that the humidity of the entire space 90 is set to be the second humidity, so long as at least the humidity of the atmosphere in contact with the liquid film 100 on the substrate W is the second humidity.

In the organic solvent processing (S6), the facing member raising/lowering unit 27 positions the facing member 6 at the second proximity position. Further, the gas valve 59 is adjusted for its opening degree and the nitrogen gas is set to be relatively large in discharge flow rate. Consequently, the humidity inside the space 90 is adjusted to a third humidity which is humidity lower than the first humidity (humidity adjusting step). In this substrate processing, immediately after the start of supplying the nitrogen gas in the second rinse liquid processing (S5), the humidity inside the space 90 has been already adjusted to the third humidity. However, the humidity inside the space 90 may be adjusted so as to be the third humidity at the start of the organic solvent processing (S6). It is not necessary that the humidity of the entire space 90 is set to be the third humidity, so long as at least the humidity of the atmosphere in contact with the liquid film 100 on the substrate W is the third humidity.

In this preferred embodiment, the position of the facing member 6 in the organic solvent processing (S6) is the second proximity position which is the same position as that of the facing member 6 in the low surface-tension liquid processing (S8), so that the third humidity is substantially similar in humidity to the second humidity. As described so far, the facing member raising/lowering unit 27 and the gas valve 59 function as a humidity adjusting unit for adjusting the humidity in the vicinity of the upper surface of the substrate W. Further, the humidity adjusting step is executed during execution of the gas supplying step.

Figure 8A:
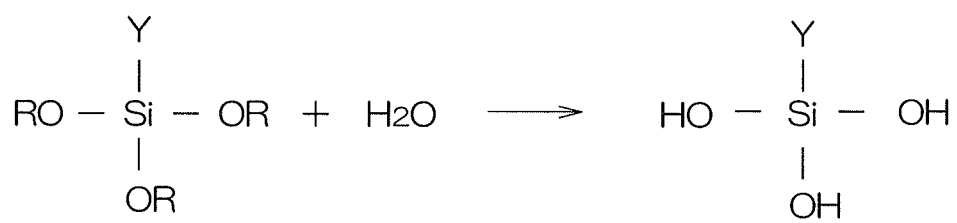
FIG. 8A is a drawing for describing reactions of water with a hydrophobic agent.
Figure 8B:
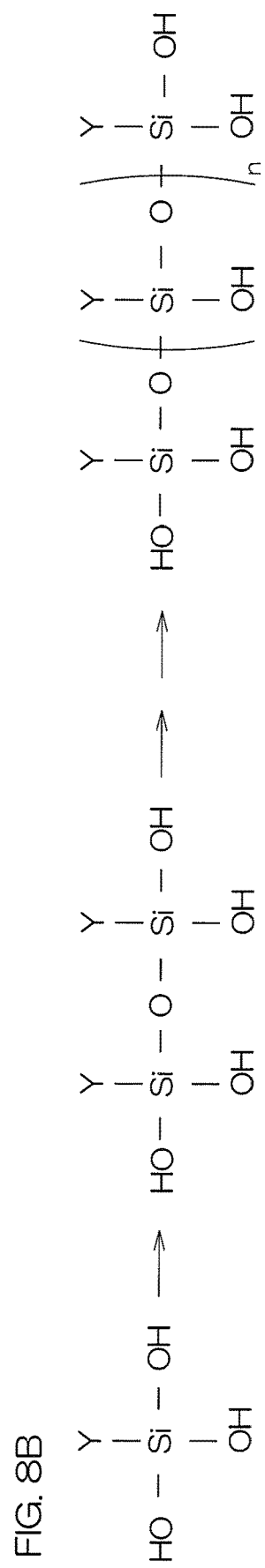
FIG. 8B is a drawing for describing a polymerization reaction of the hydrophobic agent.
Figure 8C:
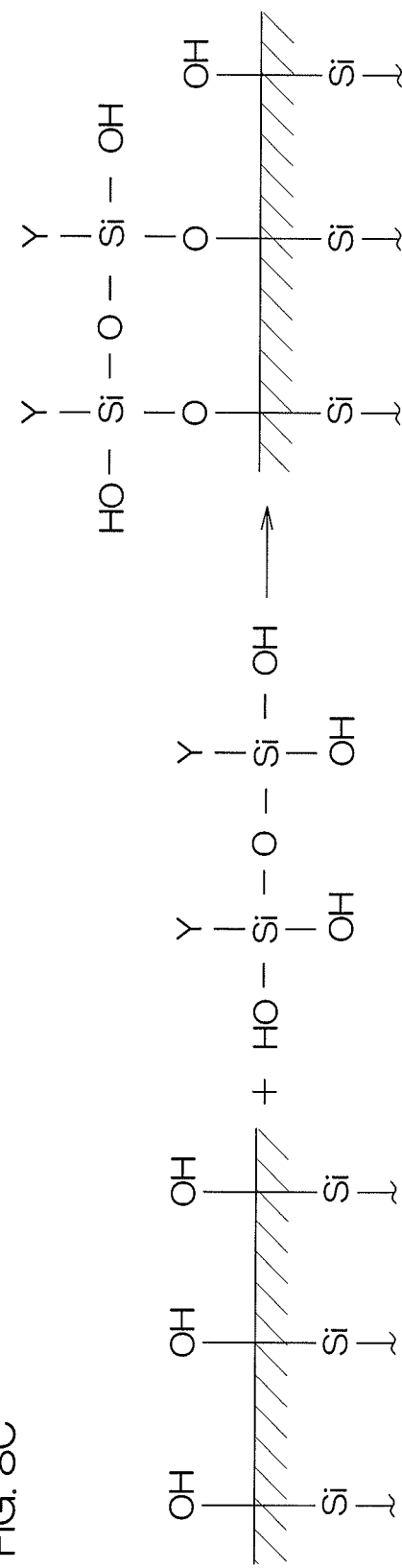
FIG. 8C is a drawing for describing reactions of the hydrophobic agent with a front surface of a substrate.

Here, a description will be given of a polymerization reaction of a hydrophobic agent and reactions of a hydrophobic agent with an upper surface of a substrate W. As shown in FIG. 8A, an unreacted hydrophobic agent is expressed by, for example, $Si(OR)_3Y$. R and Y are simplified for expressing a substituent of an alkyl group, etc. The hydrophobic agent reacts with water molecules ($H_2O$) to produce a monomer ($Si(OH)_3Y$). Then, the monomers react with each other to form a dimer (refer to a chemical formula expressed at the center of FIG. 8B). The polymerization reaction proceeds further, thereby finally forming a polymer (expressed by a chemical formula on the right side of FIG. 8B). The lower the humidity of the atmosphere in contact with the liquid film 100 on the substrate W is, the less likely the hydrophobic agent is to undergo polymerization. The higher the humidity of the atmosphere in contact with the liquid film 100 of the substrate W is, the more likely the hydrophobic agent is to cause polymerization. A reaction extent of the hydrophobic agent with the upper surface of the substrate can be judged by a contact angle.

Where the humidity of the atmosphere in contact with the liquid film 100 on the substrate W is low, before polymerization, the hydrophobic agent reacts with a hydroxyl group exposed on the upper surface of the substrate W. Thereby, the upper surface of the substrate W is hydrophobized. However, even after the upper surface of the substrate W has been hydrophobized, an unreacted hydrophobic agent remains on the substrate W, which will, therefore, cause the generation of particles.

Where the humidity of the atmosphere in contact with the liquid film 100 on the substrate W is high, the hydrophobic agent before reactions with a hydroxyl group exposed on the upper surface of the substrate W to form a polymer. Therefore, this causes the generation of particles. Thus, as shown in FIG. 8C, it is necessary to adjust the humidity of the atmosphere in contact with the liquid film 100 on the substrate W appropriately such that the hydrophobic agent will appropriately polymerize (for example, dimer).

On the other hand, in the low surface-tension liquid supplying step after the hydrophobic agent supplying step, it is necessary to decrease the humidity of the atmosphere in contact with the liquid film 100 of the substrate W in order to lower a surface tension of IPA applied to the upper surface of the substrate W. The humidity which can sufficiently lower the surface tension of IPA applied to the upper surface of the substrate W is too low in attaining appropriate polymerization of the hydrophobic agent.

According to the first preferred embodiment, the hydrophobic agent is supplied from the second tube 36 (hydrophobic agent supplying unit) to an upper surface of a substrate W (hydrophobic agent supplying step). In order to replace the hydrophobic agent on the substrate W by IPA (low surface-tension liquid), IPA is supplied from the third tube 37 (low surface-tension liquid supplying unit) to the upper surface of the substrate W (low surface-tension liquid supplying step). Then, the humidity of the atmosphere in contact with the liquid film 100 on the substrate W is adjusted such that the humidity of the atmosphere in contact with the liquid film 100 on the substrate W in the hydrophobic agent supplying step reaches the first humidity and the humidity of the atmosphere in contact with the liquid film 100 on the substrate W in the low surface-tension liquid supplying step reaches the second humidity which is humidity lower than the first humidity (humidity adjusting step).

According to the above-described configuration, the humidity of the atmosphere in contact with the liquid film 100 on the substrate W in the hydrophobic agent supplying step is made higher than the humidity of the atmosphere in contact with the liquid film 100 on the substrate W in the low surface-tension liquid supplying step.

Therefore, in the hydrophobic agent supplying step, the humidity of the atmosphere in contact with the liquid film 100 on the substrate W can be made higher to such an extent that polymerization of the hydrophobic agent will not proceed excessively. Consequently, the hydrophobic agent can be suppressed from being polymerized to attain an appropriate polymerization of the hydrophobic agent. As a result, it is possible to further suppress the generation of particles while the upper surface of the substrate W is made sufficiently hydrophobic.

Further, in the low surface-tension liquid supplying step, the humidity of the atmosphere in contact with the liquid film 100 on the substrate W can be sufficiently decreased. Thereby, it is possible to decrease the amount of water contained in the liquid film 100 of IPA on the substrate W.

It is, therefore, possible to lower a surface tension of IPA on the substrate W applied to the upper surface of the substrate W.

Further, in the first preferred embodiment, before the hydrophobic agent supplying step, IPA (organic solvent) is supplied from the third tube 37 (organic solvent supplying unit) to the upper surface of the substrate W (organic solvent supplying step). Still further, in the humidity adjusting step, the humidity of the atmosphere in contact with the liquid film 100 on the substrate W is adjusted such that the humidity of the atmosphere in contact with the liquid film 100 on the substrate W in the organic solvent supplying step reaches the third humidity which is humidity lower than the first humidity.

If water is contained in IPA on the substrate W, when IPA on the substrate W is replaced by a hydrophobic agent in the hydrophobic agent supplying step, the hydrophobic agent reacts with water in IPA. Consequently, polymerization of the hydrophobic agent proceeds and the upper surface of the substrate W may not be sufficiently hydrophobized. Thus, in such a configuration that, in the organic solvent supplying step, the humidity of the atmosphere in contact with the liquid film 100 on the substrate W is made into humidity lower than the first humidity, it is possible to suppress the hydrophobic agent from being polymerized. As a result, it is possible to further suppress the generation of particles while the upper surface of the substrate W is made sufficiently hydrophobic.

Further, in the first preferred embodiment, the nitrogen gas (the gas) is supplied from the central opening 6b (gas supplying unit) of the facing member 6 toward the space 90 (gas supplying step). In the humidity adjusting step, the humidity inside the space 90 is adjusted during execution of the gas supplying step.

According to the above-described configuration, the humidity of the space 90 is adjusted by supplying the gas to the space 90. The humidity of the space 90 can be adjusted, thereby easily adjusting the humidity of the atmosphere in contact with a liquid film 100 on the substrate W.

Here, the hydrophobic agent supplied to the upper surface of the substrate W in the hydrophobic agent supplying step may be adhered to the facing surface 6a by being splashed back from the upper surface of the substrate. If the hydrophobic agent adhered to the facing surface 6a drops on the upper surface of the substrate W in the low surface-tension liquid supplying step after the hydrophobic agent supplying step, it may cause the generation of particles. In the first preferred embodiment, the facing member raising/lowering unit 27 raises and lowers the facing member 6 in the humidity adjusting step, by which a distance between the facing surface and the upper surface of the substrate is changed from the first distance L1 to the second distance L2 which is smaller than the first distance L1. Thereby, the humidity inside the space 90 is changed from the first humidity to the second humidity. Therefore, in the hydrophobic agent supplying step, in a state that the facing member 6 is further separated from the upper surface of the substrate W than in the low surface-tension liquid supplying step, the hydrophobic agent is supplied to the upper surface of the substrate W. Therefore, it is possible to suppress the hydrophobic agent from being adhered to the facing surface 6a. It is, thereby, possible to suppress the generation of particles.

Further, in the first preferred embodiment, the facing member raising/lowering unit 27 raises and lowers the facing member 6 during execution of the low surface-tension liquid supplying step, by which a distance between the facing surface 6a and the upper surface of the substrate W is changed from the first distance L1 to the second distance L2. Therefore, at least after the start of replacing the hydrophobic agent on the upper surface of the substrate W by IPA, a distance between the facing surface 6a and the upper surface of the substrate W is changed to the second distance L2. Consequently, it is possible to further suppress the hydrophobic agent from being adhered to the facing surface 6a.

Further, in the first preferred embodiment, a flow rate of nitrogen gas supplied from the central opening 6b of the facing member 6 is adjusted in the humidity adjusting step, thereby adjusting the humidity inside the space 90. Therefore, the humidity inside the space 90 can be adjusted with high accuracy by changing a distance between the facing surface 6a and the upper surface of the substrate W and adjusting a supply flow rate of the nitrogen gas. Consequently, it is possible to adjust the humidity of the space 90 with high accuracy.

Still further, in the first preferred embodiment, the spin motor 23 (substrate rotating unit) rotates a substrate W to remove IPA on the substrate W, thereby drying the substrate W (substrate drying step). Therefore, IPA on the substrate W can be quickly removed. Consequently, it is possible to reduce the time that IPA applies a surface tension to the upper surface of the substrate W.

Second Preferred Embodiment

Figure 9:
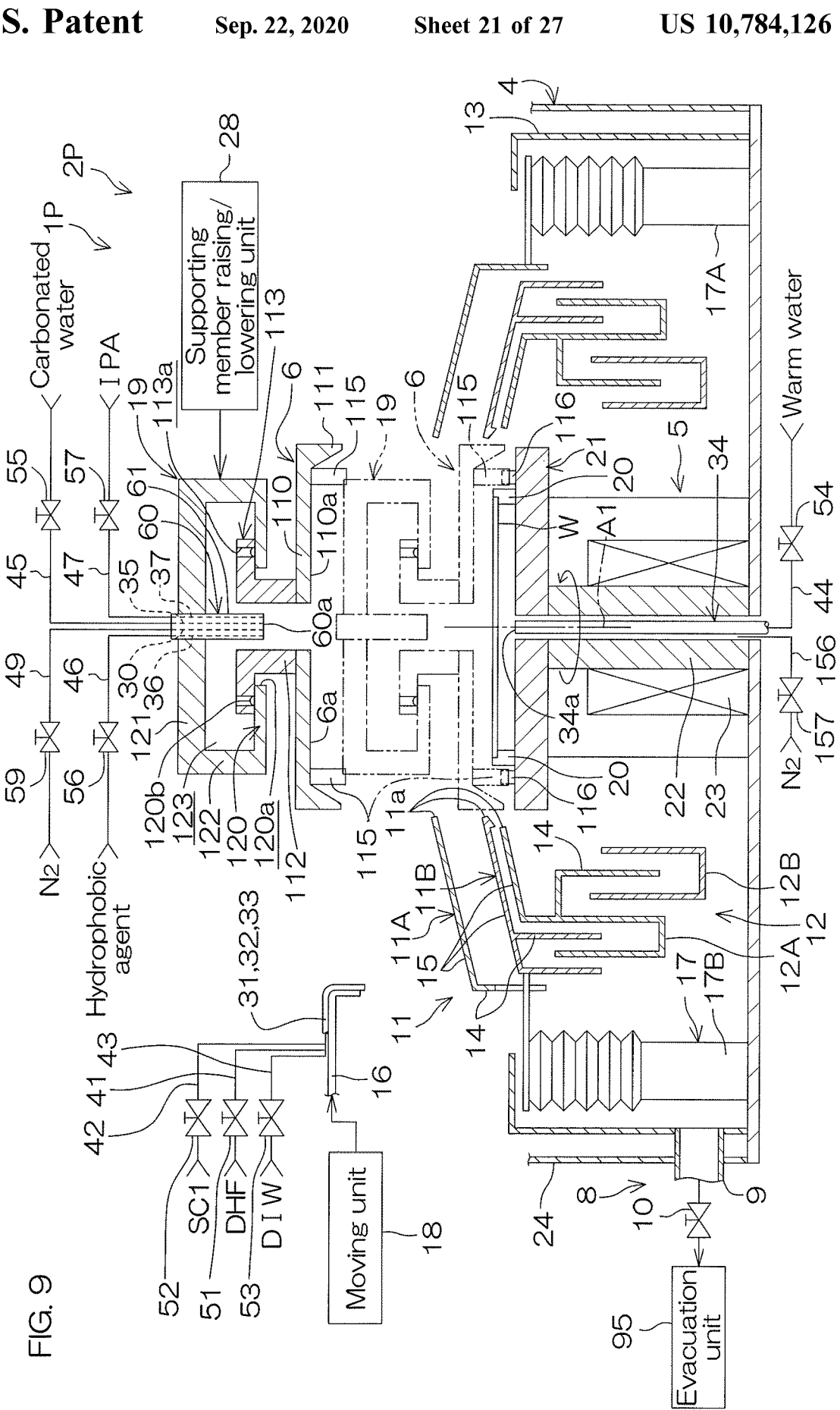
FIG. 9 is an illustrative sectional view for describing an example of configuration of a processing unit included in a substrate processing apparatus according to a second preferred embodiment.

FIG. 9 is an illustrative sectional view which describes an example of configuration of a processing unit 2P included in a substrate processing apparatus 1P according to a second preferred embodiment. In FIG. 9, the same portions as those so far described are given the same reference numerals, with a description thereof omitted (the same shall apply to FIG. 10A to FIG. 10D and FIG. 11 which will be described later). In FIG. 9, a part of the illustration of a chamber 4 is omitted for simplification.

The processing unit 2P according to the second preferred embodiment is substantially different from the processing unit 2 according to the first preferred embodiment in that a facing member 6 rotates integrally with a spin base 21 and it includes a supporting member 19 which supports and suspends the facing member 6.

The facing member 6 includes a facing portion 110, an extension portion 111, a tubular portion 112 and a plurality of flange portions 113. The facing portion 110 faces an upper surface of a substrate W from above. The facing portion 110 is formed in a disk shape. The facing portion 110 is disposed substantially horizontally above a spin chuck 5. The facing portion 110 is provided with a facing surface 110a which faces the upper surface of the substrate W. The facing surface 110a is a part of a facing surface 6a of the facing member 6.

The extension portion 111 extends downward from a peripheral edge portion of the facing portion 110. An inner circumferential surface 111a of the extension portion 111 is inclined to a rotation axis A1 so as to go outward in a radial direction of rotation of the substrate W as it goes downward. An outer circumferential surface of the extension portion 111 extends along the vertical direction.

The facing member 6 can be engaged with the spin base 21, for example, by a magnetic force. In detail, a plurality of first engagement portions 115 are mounted on the facing surface 110a of the facing portion 110 of the facing member 6. The first engagement portion 115 extends downward from the facing surface 110a of the facing portion 110. A plurality of first engagement portions 115 are disposed at intervals in a circumferential direction. A plurality of second engagement portions 116 which can be recess/protrusion engaged with the plurality of first engagement portions 115 are mounted on the upper surface of the spin base 21. The plurality of second engagement portions 116 are disposed at intervals in the circumferential direction.

In a state that the first engagement portions 115 are engaged with the second engagement portions 116, the facing member 6 is able to rotate integrally with the spin base 21. When the facing member 6 is engaged with the spin base 21, a spin motor 23 rotates the spin base 21, by which the facing member 6 is rotated together with the spin base 21. That is, the spin motor 23 also functions as a facing member rotating unit which rotates the facing member 6 around the rotation axis A1. When the facing member 6 is engaged with the spin base 21, the extension portion 111 surrounds a substrate W further to a radially inner side than the guard 11.

The tubular portion 112 is fixed to an upper surface of the facing portion 110. The plurality of flange portions 113 are disposed at an upper end of the tubular portion 112 at intervals in a circumferential direction of the tubular portion 112. Each of the flange portions 113 extends horizontally from the upper end of the tubular portion 112.

The supporting member 19 includes a facing member supporting portion 120, a nozzle supporting portion 121 and a wall portion 122. The facing member supporting portion 120 supports the facing member 6. The nozzle supporting portion 121 is disposed higher than the facing member supporting portion 120 to support a casing 61 of a central nozzle 60. The wall portion 122 couples the facing member supporting portion 120 with the nozzle supporting portion 121 and extends in the vertical direction. A space 123 is divided by the facing member supporting portion 120, the nozzle supporting portion 121 and the wall portion 122. A lower wall of the supporting member 19 is configured by the facing member supporting portion 120. An upper wall of the supporting member 19 is configured by the nozzle supporting portion 121. The space 123 houses an upper end portion of the tubular portion 112 and the flange portion 113.

The central nozzle 60 is mounted approximately at the center of the nozzle supporting portion 121. The casing 61 and the nozzle supporting portion 121 are firmly attached to each other, and no gas flow passage 62 (refer to FIG. 2) is disposed between the casing 61 and the nozzle supporting portion 121. Instead, the central nozzle 60 includes a fourth tube 30 which is housed in the casing 61. The fourth tube 30 is connected to a gas piping 49.

The facing member supporting portion 120 supports from below (the flange portion 113 of) the facing member 6. A tubular portion insertion hole 120a into which the tubular portion 112 is inserted is formed at a central portion of the facing member supporting portion 120. A positioning hole 113a which penetrates through the flange portion 113 in the up/down direction is formed at each of the flange portions 113. An engagement protrusion 120b which can be engaged with the positioning hole 113a of a corresponding flange portion 113 is formed at the facing member supporting portion 120. The engagement protrusion 120b which corresponds to each of the positioning holes 113a is engaged, by which the facing member is positioned in relation to the supporting member in a rotating direction.

The processing unit 2P is provided with a supporting member raising/lowering unit 28 in place of the facing member raising/lowering unit 27. The supporting member raising/lowering unit 28 raises and lowers the facing member 6 together with the supporting member 19. The supporting member raising/lowering unit 28 includes, for example, a ball screw mechanism (not shown) for raising and lowering the supporting member 19 and an electric motor (not shown) for applying a driving force to the ball screw mechanism. The supporting member raising/lowering unit 28 is controlled by a controller 3 (refer to FIG. 4).

The supporting member raising/lowering unit 28 is able to position the supporting member 19 at a predetermined height position between an upper position and a lower position. The lower position is a position shown in FIG. 10A which will be described later. In detail, the lower position is a position in which the supporting member 19 comes close most to the upper surface of the spin base 21 in a movable range of the supporting member 19. The upper position is a position shown by a solid line in FIG. 9. In detail, the upper position is a position in which the supporting member 19 is most separated from the upper surface of the spin base 21 in the movable range of the supporting member 19.

The supporting member 19 supports the facing member 6 in a suspending manner in a state of being positioned at the upper position. In this state, the facing member 6 is separated above from the spin base 21. The supporting member 19 is raised and lowered by the supporting member raising/lowering unit 28, thereby passes through an engagement position between the upper position and the lower position. The engagement position is a position shown by a double dotted & dashed line in FIG. 9. The engagement position is a height position of the supporting member 19, when the facing member 6 is supported from below by the supporting member 19 and also the facing member 6 is engaged with the spin base 21. When being positioned at the lower position, the supporting member 19 is separated below from the facing member 6 which is kept engaged with the spin base 21.

When the supporting member 19 is raised and lowered between the upper position and the engagement position, the facing member 6 is raised and lowered integrally with the supporting member 19. When being positioned between the engagement position and the lower position, the supporting member 19 is separated below from the facing member 6. When the supporting member 19 is positioned between the engagement position and the lower position, the facing member 6 is kept in a state of being engaged with the spin base 21.

Then, a description will be given of an example of substrate processing by the substrate processing apparatus 1P of the second preferred embodiment. FIG. 10A to FIG. 10D are each an illustrative sectional view for describing an example of the substrate processing by the substrate processing apparatus 1P. FIG. 11 is a timechart which describes an example of the substrate processing by the substrate processing apparatus 1P.

The substrate processing by the substrate processing apparatus 1P of the second preferred embodiment is substantially different from the substrate processing by the substrate processing apparatus 1 of the first preferred embodiment in that, from the second rinse liquid processing (S5) to the low surface-tension liquid processing (S8), a distance between the facing surface 6a (the facing surface 110a of the facing portion 110) of the facing member 6 and an upper surface of a substrate W is kept constant. Therefore, in the substrate processing by the substrate processing apparatus 1P, a discharge flow rate of nitrogen gas is adjusted, thereby adjusting the humidity inside the space 90. That is, in the second preferred embodiment, a gas valve 59 functions as a humidity adjusting unit.

Further, with regard to substrate carry-in (S1) to second chemical liquid processing (S4), substrate drying processing (S9) and substrate carry-out (S10), they are substantially similar to those in the substrate processing by the substrate processing apparatus 1 of the first preferred embodiment, with a description thereof omitted. With regard to second rinse liquid processing (S5) to low surface-tension liquid processing (S8), they are also substantially similar except for a position of the facing member 6. Therefore, hereinafter, they are described simply.

First, in the second rinse liquid processing (S5), a second chemical liquid valve 52 is closed. Thereby, discharge of SC1 from a second chemical liquid nozzle 32 is stopped. Then, a nozzle moving unit 18 positions a first chemical liquid nozzle 31, the second chemical liquid nozzle 32 and a first rinse liquid nozzle 33 at a retracted position.

Next, the spin motor 23 stops rotation of the spin base 21. Then, a relative position between the facing member 6 and the spin base 21 in a rotating direction is adjusted so that the facing member 6 can be engaged with the spin base 21. In detail, a position of the spin base 21 in the rotating direction is adjusted by the spin motor 23 such that the first engagement portion 115 of the facing member 6 will overlap the second engagement portion 116 of the spin base 21 in a plan view. As described so far, in this substrate processing, rotation of the spin base 21 is once stopped and a relative position between the spin base 21 and the facing member 6 in the rotating direction is then adjusted. However, a position of the spin base 21 in the rotating direction may be adjusted by the spin motor 23 such that the first engagement portion 115 of the facing member 6 will overlap the second engagement portion 116 of the spin base 21 in a plan view, when rotation of the spin base 21 is stopped.

Then, the supporting member raising/lowering unit 28 lowers the supporting member 19 positioned at the upper position toward the lower position. The supporting member 19 passes through the engagement position before moving to the lower position. When the supporting member 19 has reached the engagement position, the facing member 6 is engaged with the spin base 21 by a magnetic force. Thereby, the facing member 6 is supported from below by the spin base 21, the height position of which is fixed.

When the supporting member 19 is lowered further below from the engagement position, the facing member 6 is released from the support by the supporting member 19. In detail, the facing member supporting portion 120 of the supporting member 19 retracts below from the flange portion 113 of the facing member 6.

Figure 10A:
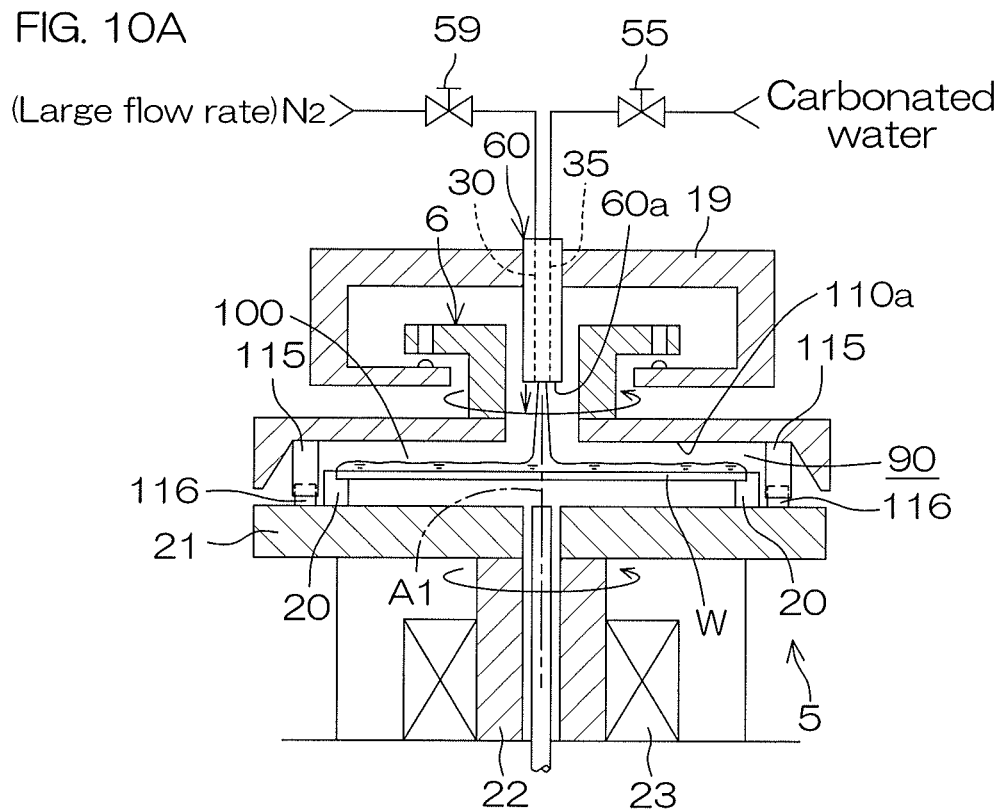
Figure 11:
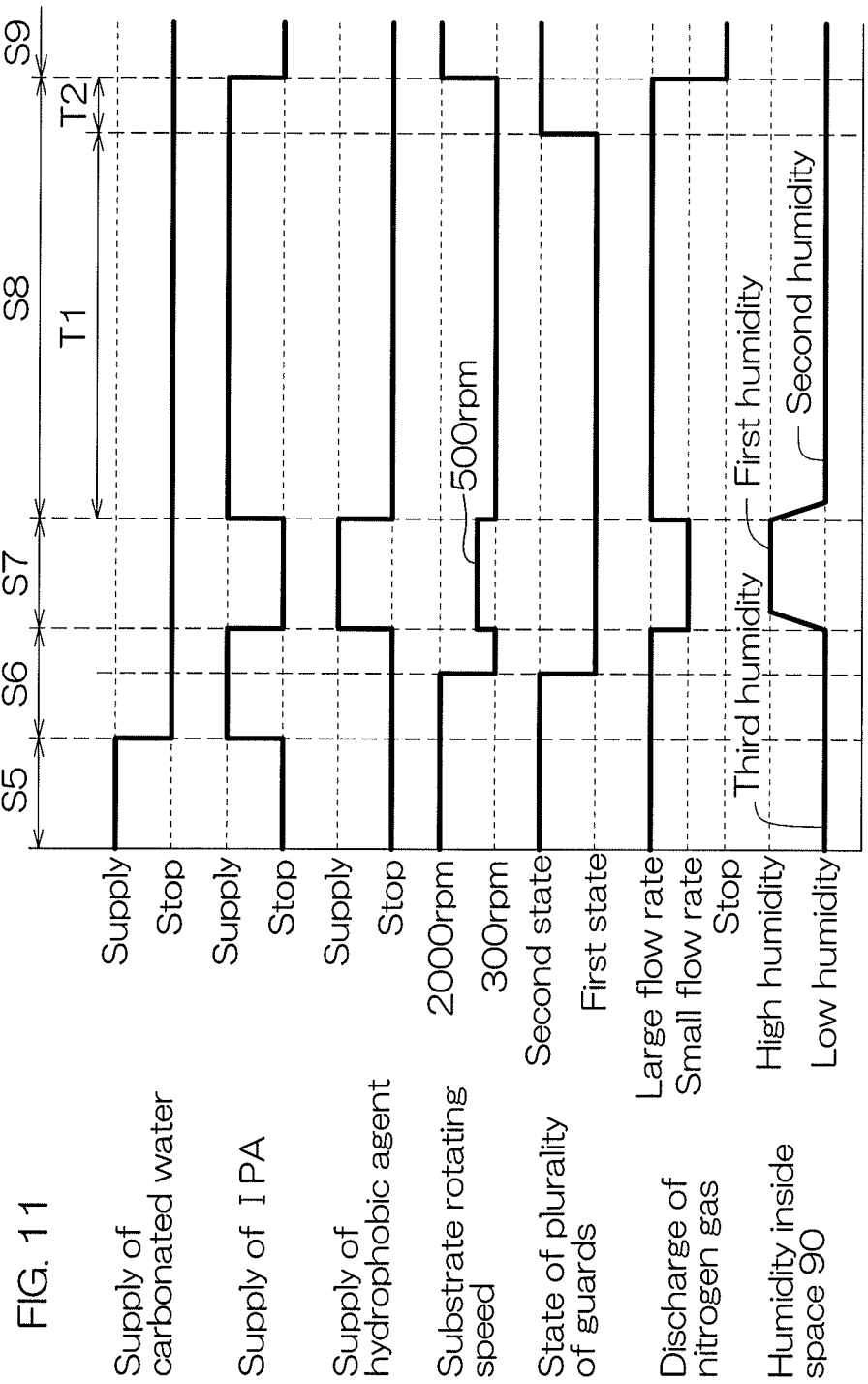
FIG. 11 is a timechart for describing one example of substrate processing by the substrate processing apparatus according to the second preferred embodiment.

Then, as shown in FIG. 10A, the supporting member 19 reaches the lower position. Thereafter, the spin motor 23 resumes rotation of the spin base 21. Since the facing member 6 is engaged with the spin base 21, it is rotated integrally with the spin base 21. Then, the gas valve 59 is opened. Thereby, nitrogen gas discharged from the fourth tube 30 of the central nozzle 60 starts to be supplied into the space 90 (gas supplying step, inert gas supplying step). Further, the evacuating valve 10 (refer to FIG. 2) is kept opened. Therefore, the atmosphere (atmosphere in the vicinity of an upper surface of a substrate W) inside the space 90 starts to be evacuated (evacuating step). Therefore, air inside the space 90 starts to be replaced and the humidity of the atmosphere inside the space 90 starts to be adjusted. In the second rinse liquid processing, a flow rate of nitrogen gas discharged from the fourth tube 30 of the central nozzle 60 (discharge flow rate) is a relatively large flow rate. A discharge flow rate of nitrogen gas in the second rinse liquid processing is, for example, 50 L/min.

Next, a second rinse liquid valve 55 is opened. Thereby, carbonated water (rinse liquid) is discharged (supplied) from the discharge port 60*a* of the first tube 35 of the central nozzle 60 toward a central region of the upper surface of the substrate W in a rotating state (rinse liquid supplying step).

Figure 10B:
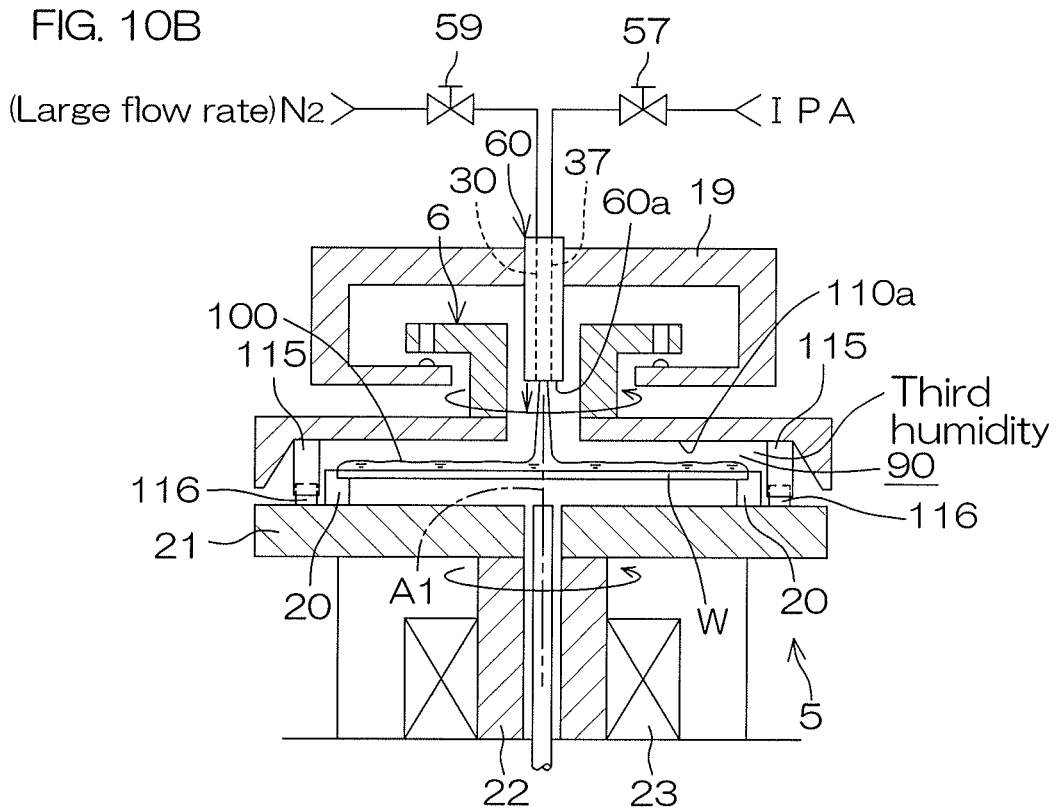

Then, the organic solvent processing (S6) is executed. Specifically, the second rinse liquid valve 55 is closed. Thereby, discharge of carbonated water from the first tube 35 is stopped. Then, as shown in FIG. 10B, the organic solvent valve 57 is opened. Thereby, IPA (organic solvent) is discharged (supplied) from the discharge port 60*a* of the third tube 37 of the central nozzle 60 toward a central region of the upper surface of the substrate W in the rotating state (organic solvent supplying step).

A discharge flow rate of nitrogen gas discharged from the fourth tube 30 is also kept at a large flow rate. The nitrogen gas is supplied at a large flow rate into the space 90, by which the humidity inside the space 90 is adjusted to a relatively low humidity (third humidity). It is not necessary that the humidity of the entire space 90 is set to be the third humidity, so long as at least the humidity of the atmosphere in contact with the liquid film 100 on the substrate W is the third humidity. Warm water (heating fluid) may be discharged from the lower surface nozzle 34 toward a central region of the lower surface of the substrate W by opening a heating fluid valve 54.

Then, the hydrophobic agent processing (S7) is started. Specifically, the organic solvent valve 57 is closed. Thereby, discharge of an organic solvent from the third tube 37 is stopped. Then, as shown in FIG. 10C, the hydrophobic agent valve 56 is opened. Thereby, a hydrophobic agent is discharged (supplied) from the discharge port 60*a* of the second tube 36 of the central nozzle 60 toward a central region of the upper surface of the substrate W in the rotating state (hydrophobic agent supplying step). Then, the opening degree of the gas valve 58 is adjusted and a discharge flow rate of nitrogen gas is, thereby, set to be a relatively small flow rate (for example, 10 L/min). Therefore, the humidity inside the space 90 between the facing surface 6*a* of the facing member 6 and the upper surface of the substrate W is adjusted to a relatively high humidity (first humidity) (humidity adjusting step). It is not necessary that the humidity of the entire space 90 is set to be the first humidity, so long as at least the humidity of the atmosphere in contact with the liquid film 100 on the substrate W is the first humidity. Evacuation of the atmosphere inside the space 90 by an evacuating unit 8 is also continuously performed even after the first guard switching step.

Next, the low surface-tension liquid processing (S8) is started. Specifically, the hydrophobic agent valve 56 is closed. Thereby, discharge of the hydrophobic agent from the second tube 36 is stopped. Then, with reference to FIG. 10D, the organic solvent valve 57 is opened. Thereby, IPA (low surface-tension liquid) is discharged (supplied) from the discharge port 60*a* of the third tube 37 of the central nozzle 60 toward a central region of the upper surface of the substrate W in the rotating state (low surface-tension liquid supplying step). Then, the opening degree of the gas valve 58 is adjusted, and a discharge flow rate of nitrogen gas is changed to a relatively large flow rate (for example, 50 L/min). Thereby, the humidity inside the space 90 is adjusted to a second humidity which is humidity lower than the first humidity (humidity adjusting step). It is not necessary that the humidity of the entire space 90 is set to be the second humidity, so long as at least the humidity of the atmosphere in contact with the liquid film 100 on the substrate W is the second humidity.

According to the second preferred embodiment, effects similar to those of the first preferred embodiment are obtained. However, they are limited to the effects other than those derived from a configuration in which the facing member 6 is moved up and down in the humidity adjusting step.

Further, according to the second preferred embodiment, in the humidity adjusting step, a distance between the facing surface 110a and the upper surface of the substrate W is kept constant to adjust a supply flow rate of nitrogen gas from the fourth tube 30 (gas supplying unit). Thereby, the humidity inside the space 90 is adjusted. Therefore, even in such a configuration that the facing member 6 cannot be moved up and down in the hydrophobic agent supplying step or the low surface-tension liquid supplying step as found in the substrate processing apparatus 1P according to the second preferred embodiment, the humidity of the space 90 between the facing surface 110a and the upper surface of the substrate W is adjusted with high accuracy.

Third Preferred Embodiment

Figure 12:
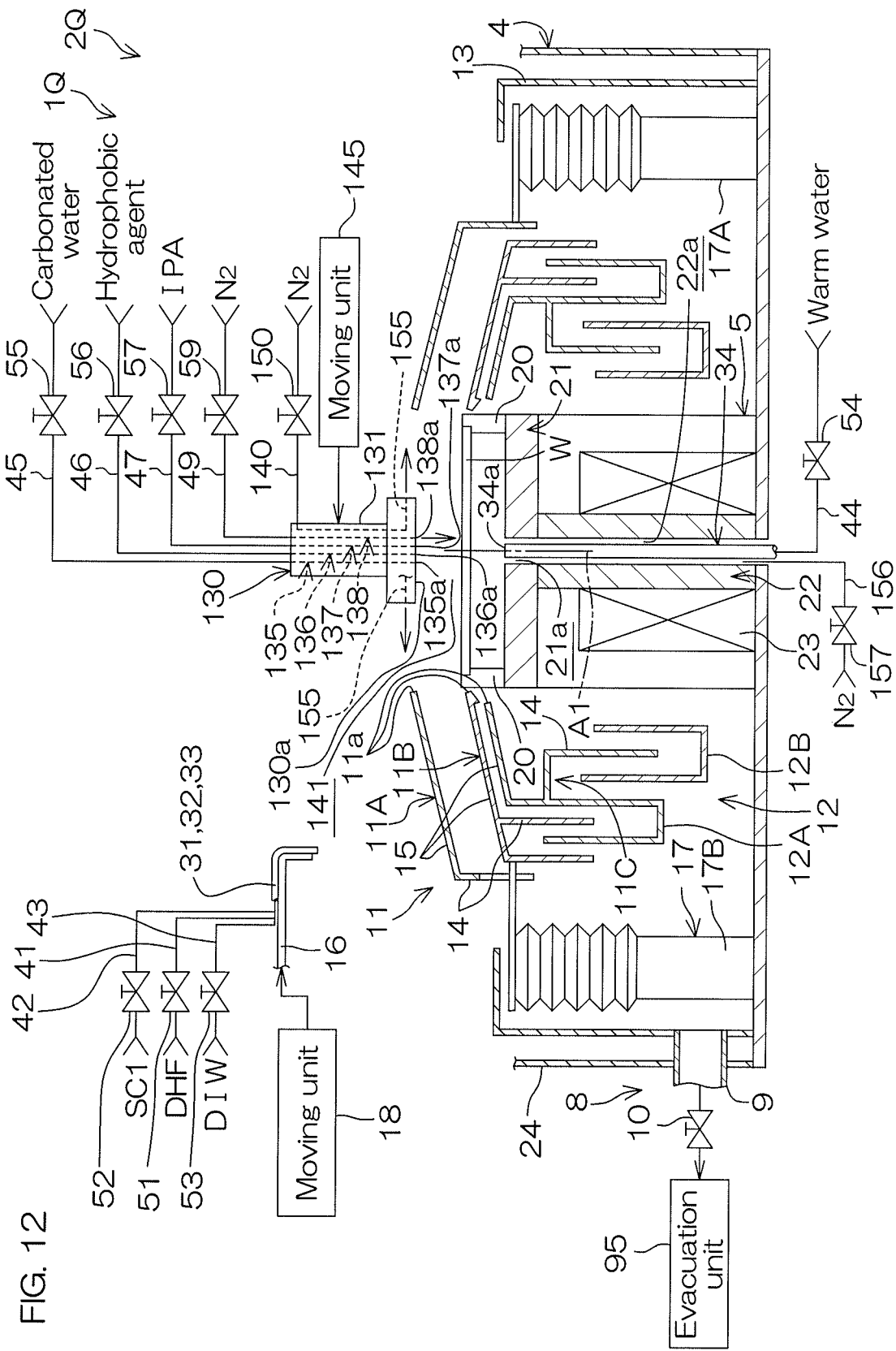
FIG. 12 is an illustrative sectional view for describing an example of configuration of a processing unit included in a substrate processing apparatus according to a third preferred embodiment.

FIG. 12 is an illustrative sectional view which describes an example of arrangement of a processing unit 2Q included in a substrate processing apparatus 1Q according to a third preferred embodiment. In FIG. 12, the same portions as those so far described are given the same reference numerals, with a description thereof omitted.

Substrate processing by the substrate processing apparatus 1Q according to the third preferred embodiment is substantially different from the substrate processing by the substrate processing apparatus 1 of the first preferred embodiment in that the processing unit 2Q includes a movement nozzle 130 having a facing surface 130a which faces an upper surface of a substrate W in place of the facing member 6.

The movement nozzle 130 includes a facing portion 131 which has the facing surface 130a and a plurality of tubes (a first tube 135, a second tube 136, a third tube 137 and a fourth tube 138), each of which is housed at the facing portion 131 and discharges a fluid to the upper surface of the substrate W. The plurality of tubes (first tube 135, second tube 136, third tube 137 and fourth tube 138) are provided respectively with discharge ports 135a to 138a, each of which discharges a fluid toward the upper surface of the substrate W.

The first tube 135 is connected to the second rinse liquid piping 45 in which the second rinse liquid valve 55 is interposed. Therefore, a rinse liquid such as carbonated water, etc., is discharged from the discharge port 135a of the first tube 135.

The second tube 136 is connected to the hydrophobic agent piping 46 in which the hydrophobic agent valve 56 is interposed. Therefore, a hydrophobic agent is discharged from the discharge port 136a of the second tube 136. The second tube 136 is an example of a hydrophobic agent supplying unit.

The third tube 137 is connected to the organic solvent piping 47 in which the organic solvent valve 57 is interposed. Therefore, an organic solvent such as IPA, etc., is discharged from a discharge port 137a of the third tube 137. The third tube 137 is an example of the organic solvent supplying unit. The third tube 137 is also an example of the low surface-tension liquid supplying unit.

The fourth tube 138 is connected to the gas piping 49 in which the gas valve 59 is interposed. Therefore, a gas such as nitrogen gas, etc., is discharged from the discharge port 138a of the fourth tube 138. The fourth tube 138 is an example of the gas supplying unit.

A discharge port for discharging a gas such as nitrogen gas, etc., in the horizontal direction may be formed at the facing portion 131 of the movement nozzle 130. A flow passage 155 for guiding a gas to the discharge port is formed at the facing portion 131, and a gas piping 140 in which a gas valve 150 is interposed is connected to the flow passage 155. The gas valve 150 is controlled by a controller 3 (refer to FIG. 4). Similarly, a discharge port (not shown) for discharging a gas such as nitrogen gas, etc., in an inclined direction which is inclined in relation to the horizontal direction may be formed at the facing portion 131 of the movement nozzle 130.

The processing unit 2Q includes a nozzle moving unit 145 which moves the movement nozzle 130 at least in the horizontal direction. The nozzle moving unit 145 is controlled by the controller 3 (refer to FIG. 4). The nozzle moving unit 145 moves the movement nozzle 130 horizontally between a processing position and a retracted position. When the movement nozzle 130 is positioned at the processing position, a processing liquid discharged from the movement nozzle 130 lands on a central portion of an upper surface of a substrate W. When being positioned at the retracted position, the movement nozzle 130 is positioned around the spin chuck 5 in a plan view. The nozzle moving unit 145 includes an electric motor (not shown) which applies a driving force for rotating the movement nozzle 130 around a predetermined rotation axis extending in the vertical direction.

Figure 13:
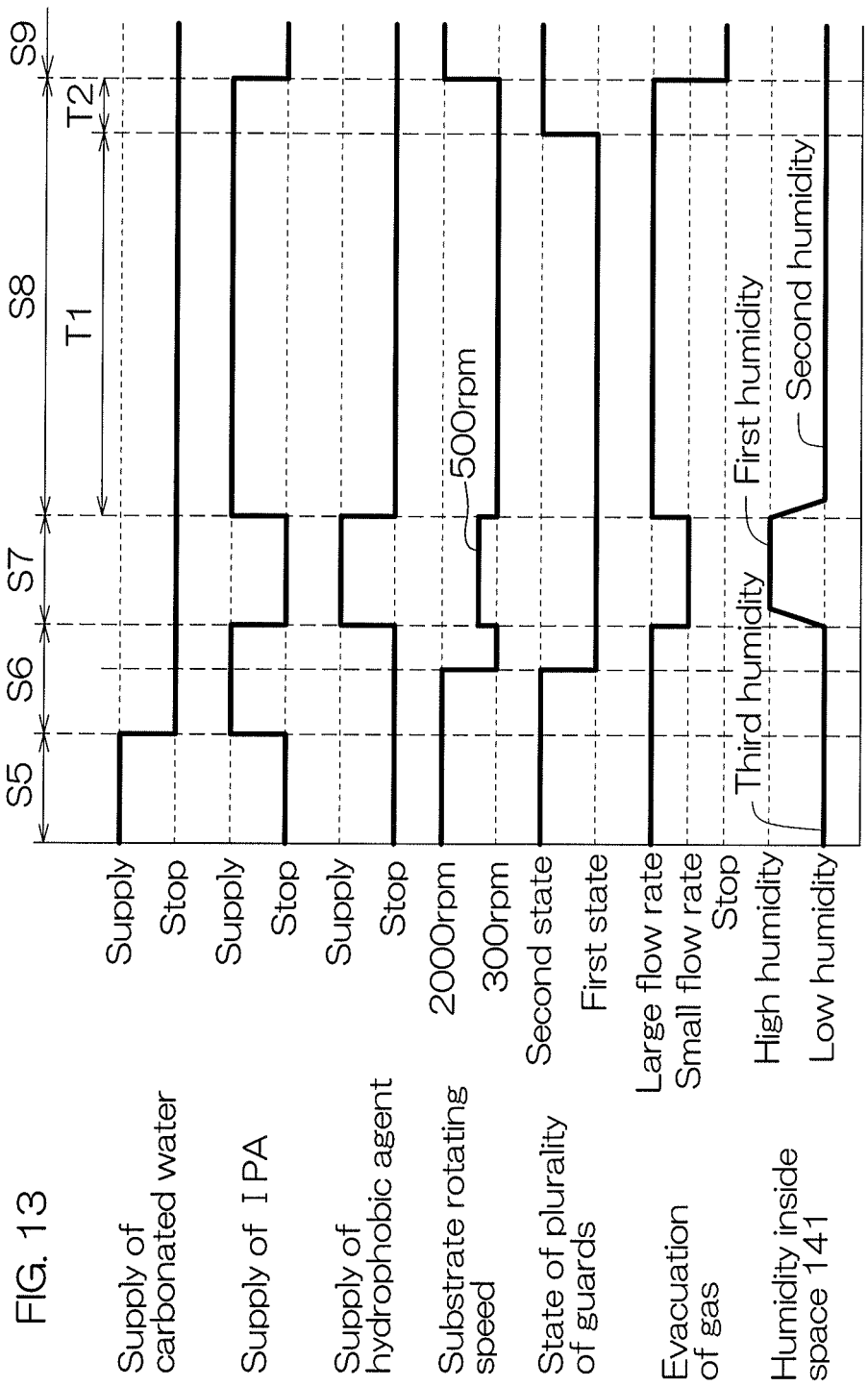
FIG. 13 is a timechart for describing one example of substrate processing by the substrate processing apparatus according to the third preferred embodiment.

Then, a description will be given of one example of substrate processing by the substrate processing apparatus 1Q of the third preferred embodiment. FIG. 13 is a timechart for describing one example of the substrate processing by the substrate processing apparatus 1Q.

In the substrate processing by the substrate processing apparatus 1Q, from substrate carry-in (S1) to second chemical liquid processing (S4), the movement nozzle 130 is positioned at the retracted position. The movement nozzle 130 is moved to the processing position in second rinse liquid processing (S5) and kept at the processing position until completion of drying processing (S9). In the substrate processing by the substrate processing apparatus 1Q, carbonated water is discharged from the first tube 135 in place of the first tube 35, and a hydrophobic agent is discharged from the second tube 136 in place of the second tube 36. Then, IPA is discharged from the third tube 137 in place of the third tube 37. Then, nitrogen gas is discharged from the fourth tube 138 in place of the central opening 6b of the facing member 6.

In the substrate processing by the substrate processing apparatus 1Q, the opening degree of the evacuating valve 10 is adjusted, thereby adjusting a flow rate (evacuation flow rate) of a gas evacuated from the evacuating duct 9. Thereby, the humidity is adjusted inside a space 141 (humidity of the atmosphere in contact with a liquid film on the substrate W) between the upper surface of the substrate W and the facing surface 130a of the movement nozzle 130 (humidity adjusting step). In the third preferred embodiment, the evacuating valve 10 functions as the humidity adjusting unit.

In detail, the larger the flow rate of a gas evacuated from the evacuating duct 9 is, the more water vapor inside the space 141 between the facing surface 130a of the movement nozzle 130 and the upper surface of the substrate W is evacuated. Thus, the humidity is decreased inside the space 141 between the facing surface 130a of the movement nozzle 130 and the upper surface of the substrate W.

As shown in FIG. 13, in the second rinse liquid processing (S5) and organic solvent processing (S6), the opening degree of the evacuating valve 10 is adjusted such that an evacuation flow rate can be a relatively large flow rate. Then, in hydrophobic agent processing (S7), the opening degree of the evacuating valve 10 is adjusted such that the evacuation flow rate can be a relatively small flow rate. Then, in low surface-tension liquid processing (S8), the opening degree of the evacuating valve 10 is adjusted such that the evacuation flow rate can be a relatively large flow rate. Thereby, the humidity inside the space 141 is adjusted such that the humidity inside the space 141 in the hydrophobic agent processing (S7) reaches the first humidity and the humidity inside the space 141 in the low surface-tension liquid processing (S8) reaches a second humidity which is humidity lower than the first humidity. Further, the humidity inside the space 141 is also adjusted such that the humidity inside the space 141 in the organic solvent processing (S6) reaches a third humidity which is humidity lower than the first humidity.

The present invention is not restricted to the preferred embodiments described above and may be executed in yet other embodiments.

For example, in the substrate processing by the substrate processing apparatus 1 according to the first preferred embodiment (substrate processing described in FIG. 5 to FIG. 7), the humidity inside the space 90 is adjusted by changing a distance between the facing surface 6a of the facing member 6 and the upper surface of the substrate W, and changing a discharge flow rate of nitrogen gas from the central opening 6b of the facing member 6. However, unlike the above-described substrate processing, the humidity inside the space 90 may be adjusted only by changing a distance between the facing surface 6a of the facing member 6 and the upper surface of the substrate W. In this case, from the second rinse liquid processing (S5) to the low surface-tension liquid processing (S8), nitrogen gas is discharged at a fixed flow rate from the central opening 6b of the facing member 6. Further, the humidity inside the space 90 may be adjusted by changing a distance between the facing surface 6a of the facing member 6 and the upper surface of the substrate W and changing an aperture of the evacuating valve 10.

Further, in the hydrophobic agent processing (S7) of the first preferred embodiment, a hydrophobic agent may be discharged from the internal nozzle 38 to supply the hydrophobic agent to the upper surface of the substrate W.

In the substrate processing by the substrate processing apparatus 1P according to the second preferred embodiment, (the substrate processing described in FIG. 9 to FIG. 11), the humidity inside the space 90 is adjusted by changing a discharge flow rate of nitrogen gas from the fourth tube 30. However, unlike the above-described substrate processing, the humidity inside the space 90 may be adjusted by changing a discharge flow rate of nitrogen gas from the fourth tube 30, and by changing an aperture of the evacuating valve 10.

Further, in the above-described first preferred embodiment and second preferred embodiment, adjustment of the humidity by supplying nitrogen gas is started from the second rinse liquid processing (S5). However, supply of nitrogen gas may be started from the organic solvent processing (S6). In this case, after start of the organic solvent processing (S6), the humidity of the space 90 reaches the third humidity.

Further, in the above-described preferred embodiments, in the organic solvent processing (S6), the humidity of the space 90 or 141 is adjusted to the third humidity. However, the humidity of the space 90 or 141 may be adjusted from the hydrophobic agent processing (S7). That is, in the substrate processing apparatus 1, 1P or 1Q, there may be executed such substrate processing that the humidity of the space 90 or 141 is not adjusted to the third humidity in the organic solvent processing (S6).

In the substrate processing by the substrate processing apparatus 1Q of the third preferred embodiment (the substrate processing described in FIG. 13), the humidity inside the space 141 is adjusted by changing an evacuation flow rate of a gas from the evacuating duct 9. However, unlike the above-described substrate processing, the humidity inside the space 141 may be adjusted by changing a discharge flow rate of nitrogen gas from the fourth tube 138, and changing the opening degree of the evacuating valve 10.

Further, in each of the above-described preferred embodiments, a gas such as nitrogen gas, etc., may be supplied from a gas piping 156 in which a gas valve 157 is interposed to the internal space 22a of the rotating shaft 22 (strictly speaking, a space between an inner circumferential surface of the rotating shaft 22 and an outer circumferential surface of the lower surface nozzle 34). The gas supplied to the internal space 22a flows above in the internal space 22a and is discharged upward from a penetrating hole 21a of the spin base 21. The gas discharged from the penetrating hole 21a flows around to the upper surface of the substrate W, thus making it possible to adjust the humidity inside the space 90. In order to adjust the humidity inside the space 90 or 141, the gas discharged from the penetrating hole 21a of the spin base 21 may be used in place of the gas discharged from the central opening 6b of the facing member 6 and the fourth tube 30 or 138. Further, the gas discharged from the central opening 6b of the facing member 6 and the fourth tube 30 or 138 may be used together with the gas discharged from the penetrating hole 21a of the spin base 21.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The present application corresponds to Japanese Patent Application No. 2017-166502 filed in the Japan Patent Office on Aug. 31, 2017, and the entire disclosure of this application is incorporated herein by reference.

What is claimed is:

1. A substrate processing method comprising:
   a substrate holding step of holding a substrate horizontally;
   a hydrophobic agent supplying step of supplying to an upper surface of the substrate a hydrophobic agent which is a liquid for hydrophobizing the upper surface of the substrate;
   a low surface-tension liquid supplying step of supplying a low surface-tension liquid lower in surface tension than water to the upper surface of the substrate in order to replace the hydrophobic agent on the substrate by the low surface-tension liquid;
   a humidity adjusting step of adjusting humidity of the atmosphere in contact with a liquid film on the substrate such that the humidity of the atmosphere in contact with the liquid film on the substrate in the hydrophobic agent supplying step reaches a first humidity and the humidity of the atmosphere in contact with the liquid film on the substrate in the low surface-tension liquid supplying step reaches a second humidity which is a humidity lower than the first humidity; and an organic solvent supplying step of supplying an organic solvent which is miscible with water and the hydrophobic agent to the upper surface of the substrate before the hydrophobic agent supplying step, wherein the humidity adjusting step includes a step of adjusting the humidity of the atmosphere in contact with the liquid film on the substrate such that the humidity of the atmosphere in contact with the liquid film on the substrate in the organic solvent supplying step reaches a third humidity which is humidity lower than the first humidity.

2. The substrate processing method according to claim 1, further comprising: a gas supplying step of supplying a gas toward a space between a facing surface, which faces the upper surface of the substrate, of a facing member and the upper surface of the substrate;

wherein the humidity adjusting step includes a step of adjusting humidity inside the space such that the humidity of the space in the hydrophobic agent supplying step reaches the first humidity and the humidity of the space in the low surface-tension liquid supplying step reaches the second humidity during execution of the gas supplying step.

3. The substrate processing method according to claim 1, further comprising: an evacuating step of evacuating the atmosphere that is in contact with the liquid film on the substrate;

wherein the humidity adjusting step includes a step in which an evacuation flow rate of the atmosphere which is evacuated in the evacuating step is adjusted, thereby adjusting the humidity of the atmosphere in contact with the liquid film on the substrate.

4. The substrate processing method according to claim 1, further comprising:

a substrate rotating step of rotating the substrate around a vertical rotation axis which passes through a central portion of the substrate, and a substrate drying step in which the substrate is rotated to remove the low surface-tension liquid on the substrate, thereby drying the substrate.

5. The substrate processing method according to claim 1, wherein the third humidity is the same as the second humidity.

6. The substrate processing method according to claim 2, wherein the humidity adjusting step includes a step in which a distance between the facing surface and the upper surface of the substrate is changed from a first distance which is a distance between the facing surface and the upper surface of the substrate in the hydrophobic agent supplying step to a second distance which is smaller than the first distance, thereby changing the humidity inside the space from the first humidity to the second humidity.

7. The substrate processing method according to claim 2, wherein the humidity adjusting step includes a step in which, while a distance between the facing surface and the upper surface of the substrate is kept constant, a supply flow rate of the gas is adjusted, thereby adjusting the humidity inside the space.

8. The substrate processing method according to claim 6, wherein the step in which the humidity inside the space is changed from the first humidity to the second humidity includes a step in which, during execution of the low surface-tension liquid supplying step, a distance between the facing surface and the upper surface of the substrate is changed from the first distance to the second distance.

9. The substrate processing method according to claim 6, wherein the humidity adjusting step includes a step in which a supply flow rate of the gas is adjusted, thereby adjusting the humidity inside the space.

10. A substrate processing method comprising:

a substrate holding step of holding a substrate horizontally;

a hydrophobic agent supplying step of supplying to an upper surface of the substrate a hydrophobic agent which is a liquid for hydrophobizing the upper surface of the substrate;

a low surface-tension liquid supplying step of supplying a low surface-tension liquid lower in surface tension than water to the upper surface of the substrate in order to replace the hydrophobic agent on the substrate by the low surface-tension liquid;

a humidity adjusting step of adjusting humidity of the atmosphere in contact with a liquid film on the substrate such that the humidity of the atmosphere in contact with the liquid film on the substrate in the hydrophobic agent supplying step reaches a first humidity and the humidity of the atmosphere in contact with the liquid film on the substrate in the low surface-tension liquid supplying step reaches a second humidity which is humidity lower than the first humidity; and a gas supplying step of supplying a gas toward a space between a facing surface, which faces the upper surface of the substrate, of a facing member and the upper surface of the substrate, wherein the humidity adjusting step includes a step of adjusting humidity inside the space such that the humidity of the space in the hydrophobic agent supplying step reaches the first humidity and the humidity of the space in the low surface-tension liquid supplying step reaches the second humidity during execution of the gas supplying step, and the humidity adjusting step includes a step in which a distance between the facing surface and the upper surface of the substrate is changed from a first distance which is a distance between the facing surface and the upper surface of the substrate in the hydrophobic agent supplying step to a second distance which is smaller than the first distance, thereby changing the humidity inside the space from the first humidity to the second humidity.

11. A substrate processing method comprising:

a substrate holding step of holding a substrate horizontally;

a hydrophobic agent supplying step of supplying to an upper surface of the substrate a hydrophobic agent which is a liquid for hydrophobizing the upper surface of the substrate;

a low surface-tension liquid supplying step of supplying a low surface-tension liquid lower in surface tension than water to the upper surface of the substrate in order to replace the hydrophobic agent on the substrate by the low surface-tension liquid;

a humidity adjusting step of adjusting humidity of the atmosphere in contact with a liquid film on the substrate such that the humidity of the atmosphere in contact with the liquid film on the substrate in the hydrophobic agent supplying step reaches a first humidity and the humidity of the atmosphere in contact with the liquid film on the substrate in the low surface-tension liquid supplying step reaches a second humidity which is humidity lower than the first humidity; and a gas supplying step of supplying a gas toward a space between a facing surface, which faces the upper surface of the substrate, of a facing member and the upper surface of the substrate, wherein the humidity adjusting step includes a step of adjusting humidity inside the space such that the humidity of the space in the hydrophobic agent supplying step reaches the first humidity and the humidity of the space in the low surface-tension liquid supplying step reaches the second humidity during execution of the gas supplying step, and the humidity adjusting step includes a step in which a supply flow rate of the gas is changed such that the supply flow rate of the gas in the low surface-tension liquid supplying step is made larger than the supply flow rate of the gas in the hydrophobic agent supplying step, thereby changing the humidity inside the space from the first humidity to the second humidity.

* * * * *